US012672364B2

(12) United States Patent　　　　　(10) Patent No.:　US 12,672,364 B2
Leuenberger et al.　　　　　　　　　(45) Date of Patent:　　Jun. 30, 2026

(54) IR PHOTODETECTOR WITH GRAPHENE AND PHASE CHANGE LAYERS AND RELATED METHODS

(71) Applicant: UNIVERSITY OF CENTRAL FLORIDA RESEARCH FOUNDATION, INC., Orlando, FL (US)

(72) Inventors: Michael N. Leuenberger, Orlando, FL (US); Muhammad Waqas Shabbir, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 740 days.

(21) Appl. No.: 17/932,112

(22) Filed: Sep. 14, 2022

(65) Prior Publication Data

US 2023/0082228 A1　　　Mar. 16, 2023

Related U.S. Application Data

(60) Provisional application No. 63/261,227, filed on Sep. 15, 2021.

(51) Int. Cl.
　　*H10F 30/21*　　　　(2025.01)
(52) U.S. Cl.
　　CPC ......... *H10F 30/288* (2025.01); *H10F 30/289* (2025.01)
(58) Field of Classification Search
　　CPC ....... H10F 30/00; H10F 30/288; H10F 30/289
　　See application file for complete search history.

(56) References Cited

U.S. PATENT DOCUMENTS 8,513,605 B2　　8/2013　Beratan
8,916,825 B1　　12/2014　Egerton et al.
(Continued)

FOREIGN PATENT DOCUMENTS

CN　　　101886261　　　11/2010
CN　　　106206830　　　12/2016

OTHER PUBLICATIONS

Takeya et al. "Bolometric photodetection using plasmon-assisted resistivity change in vanadium dioxide" Scientific Reports: (2018) 8:12764; published Aug. 24, 2018; pp. 5.
(Continued)

*Primary Examiner* — William B Partridge
*Assistant Examiner* — Felix B Andrews
(74) *Attorney, Agent, or Firm* — Allen, Dyer, Doppelt + Gilchrist, PA

(57)　　　　　　ABSTRACT

An IR photodetector includes an electrically conductive layer, a first dielectric layer over the electrically conductive layer, and a phase change material layer over the first dielectric layer. The IR photodetector further includes first and second electrically conductive contacts coupled to the phase change material layer, and a graphene layer over the phase change material layer and having a perforated pattern therein. The IR photodetector includes circuitry configured to apply a bias voltage between the first and second electrically conductive contacts, and detect a sensing current in the phase change material layer caused by IR radiation received by the graphene layer, the IR radiation having a frequency range based upon the bias voltage.

21 Claims, 19 Drawing Sheets

(56) References Cited

U.S. PATENT DOCUMENTS

| | | | |
|---|---|---|---|
| 9,212,950 B2 | 12/2015 | Xu et al. | |
| 10,084,102 B2 | 9/2018 | Cai et al. | |
| 10,297,700 B1 | 5/2019 | Egerton et al. | |
| 10,302,498 B1 | 5/2019 | Sood et al. | |
| 10,312,389 B2 | 6/2019 | Chanda et al. | |
| 10,749,058 B2 | 8/2020 | So et al. | |
| 10,784,387 B2 | 9/2020 | Chanda et al. | |
| 11,217,738 B2 | 1/2022 | Chanda et al. | |
| 2016/0020280 A1* | 1/2016 | Heo | H10N 70/20 |
| | | | 257/27 |
| 2016/0238453 A1* | 8/2016 | Tsuchiya | G01J 5/20 |
| 2017/0221596 A1* | 8/2017 | Caldwell | G21K 5/00 |
| 2019/0339585 A1* | 11/2019 | Heck | G02F 1/295 |
| 2020/0209059 A1* | 7/2020 | Sarwat | H10N 70/231 |
| 2022/0181375 A1* | 6/2022 | Nakagome | H10F 39/12 |
| 2022/0216360 A1* | 7/2022 | Norimatsu | H10F 77/413 |
| 2023/0082228 A1 | 3/2023 | Leuenberger et al. | |

OTHER PUBLICATIONS

Lu et al. "CVD preparation of vertical graphene nanowalls/VO2 (B) composite films with superior thermal sensitivity in uncolled infrared detector" Journal of Materiomics: 6; 2020; pp. 280-285.

Blaikie et al. "A fast and sensitive room-temperature graphene nanomechanical bolometer" Nature Communications: (2019) 10:4726; pp. 9.

Jiang et al. "A versatile photodetector assisted by photovoltaic and bolometric effects"Light: Science & Applications (2020) 9:160; pp. 9.

* cited by examiner

1000

1070

1090

1120

1130

1140

IR PHOTODETECTOR WITH GRAPHENE AND PHASE CHANGE LAYERS AND RELATED METHODS

RELATED APPLICATION

This application is based upon prior filed Application No. 63/261,227 filed Sep. 15, 2021, the entire subject matter of which is incorporated herein by reference in its entirety.

TECHNICAL FIELD

The present disclosure relates to the field of photodetectors, and, more particularly, to an infrared photodetector and related methods.

BACKGROUND

Infrared (IR) photodetectors are useful in many applications. For example, IR photodetectors can be used in spectroscopy applications. In some applications, IR photodetectors are used for communications in electro-optic platforms. In some approaches, graphene has been used in IR applications. Graphene, one of the widely studied two dimensional materials, comprises a single layer of carbon atoms in a honeycomb lattice. It has special electrical, optical, and mechanical properties due to its tunable band dispersion relation and atomic thickness. Because of its unique band structure, graphene possesses very high mobility and fast carrier relaxation time, making it an attractive candidate for ultrafast electronics and optoelectronic devices such as transistors, optical switches, mid-wavelength infrared (MWIR) photodetectors, photovoltaic devices, saturated absorbers and ultrafast lasers, etc.

For example, U.S. Pat. Nos. 10,784,387 and 10,312,389 are assigned to the present application's assignee and each discloses an optical detector device including a substrate, and a reflector layer carried by the substrate. The optical detector device comprises a first dielectric layer over the reflector layer, and a graphene layer over the first dielectric layer and having a perforated pattern therein.

SUMMARY

Generally, an IR photodetector includes an electrically conductive layer, a first dielectric layer over the electrically conductive layer, and a phase change material layer over the first dielectric layer. The IR photodetector further includes first and second electrically conductive contacts coupled to the phase change material layer, and a graphene layer over the phase change material layer and having a perforated pattern therein. The IR photodetector comprises circuitry configured to apply a bias voltage between the first and second electrically conductive contacts, and detect a sensing current in the phase change material layer caused by IR radiation received by the graphene layer, the IR radiation having a frequency range based upon the bias voltage.

In some embodiments, the phase change material layer may have a thickness gradient. The bias voltage may comprise a pulse train or a multi-level pulse train. For example, the phase change material layer may comprise vanadium oxide.

Additionally, the IR photodetector may further comprise a transparent electrically conductive layer over the phase change material layer, a second dielectric layer over the phase change material layer, and a protective layer over the graphene layer. The first dielectric layer may comprise a polymer layer, and the second dielectric layer may comprise silicon nitride, for example. In some embodiments, the perforated pattern may comprise an array of elliptical holes. The graphene layer may be configured to receive at least one of mid-wavelength IR (MWIR) radiation and long wavelength IR (LWIR). The electrically conductive layer may comprise at least one of gold, silver, and platinum.

Another aspect is directed to a method of making an IR photodetector. The method comprises forming a first dielectric layer over an electrically conductive layer, and forming a phase change material layer over the first dielectric layer. The method further comprises forming first and second electrically conductive contacts coupled to the phase change material layer, and forming a graphene layer over the phase change material layer and having a perforated pattern therein. The method also includes coupling circuitry to apply a bias voltage between the first and second electrically conductive contacts, and detect a sensing current in the phase change material layer caused by IR radiation received by the graphene layer, the IR radiation having a frequency range based upon the bias voltage.

DETAILED DESCRIPTION

Figure 1:
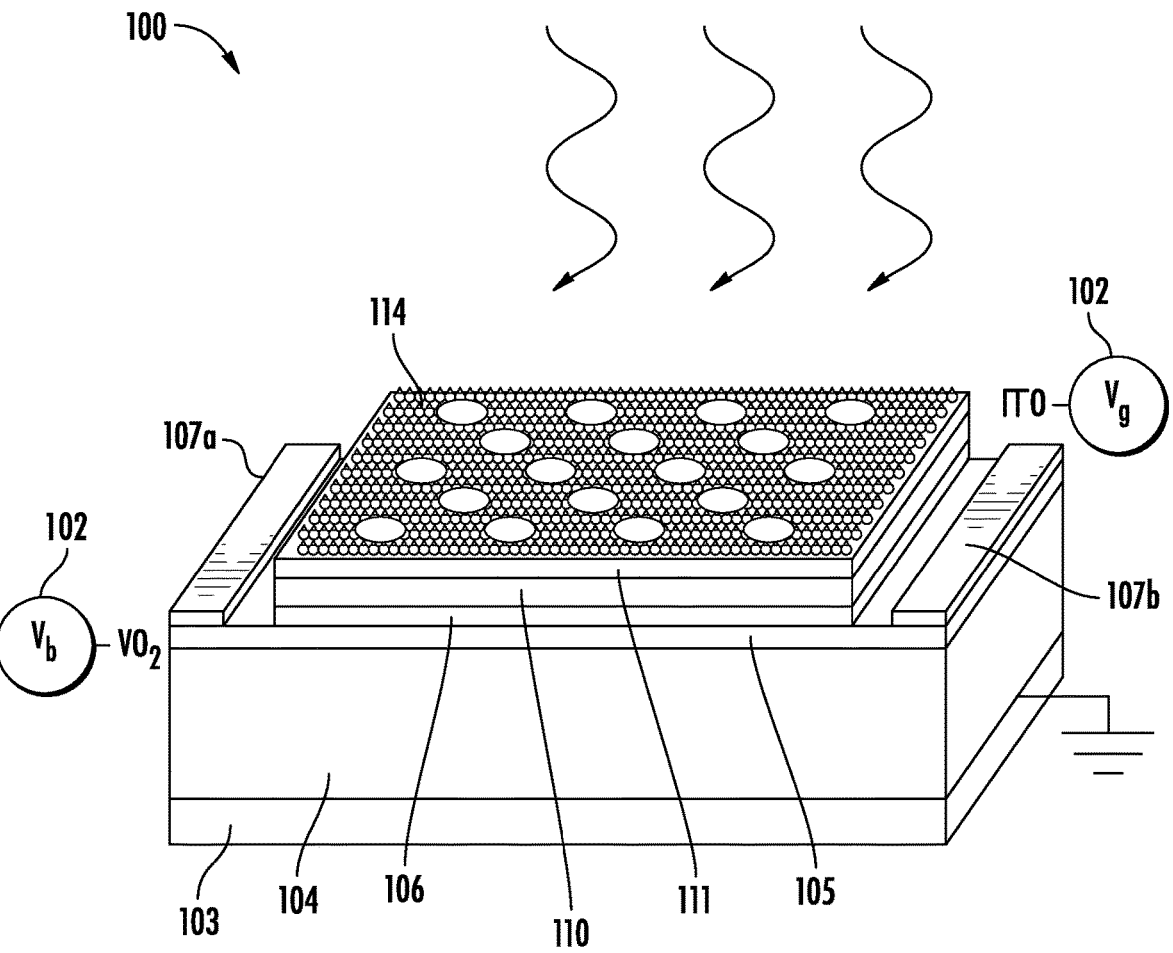
FIG. 1 is a perspective view of a first embodiment of an IR photodetector, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

FIG. 1 shows an insulator-to-metal phase transition (IMT)-based mid-IR light photodetector 100 comprising a hybrid nanopatterned graphene (NPG)-VO₂. The materials from top to bottom are: 1 single layer of hexagonal boron nitride (h-BN), for preventing oxidation of graphene at higher temperatures (*), 1 single layer of patterned graphene (*), 65 nm of Si₃N₄ (*), for large n-doping and gating, 65 nm of ITO (*), metallic contact for gating, which is also transparent in mid-IR, 20 nm of h-BN (*), used for efficient heat transfer, 3 nm of VO₂ (*), contacted with source and drain Au leads, λ/4nSU-8 of SU-8, [12] which is transparent in mid-IR, and Au back mirror. $n_{SU-8}$=1.56 is the refractive index of SU-8. All the layers marked with an asterisk (*) are patterned with the same hexagonal lattice of holes.

Figure 2A:
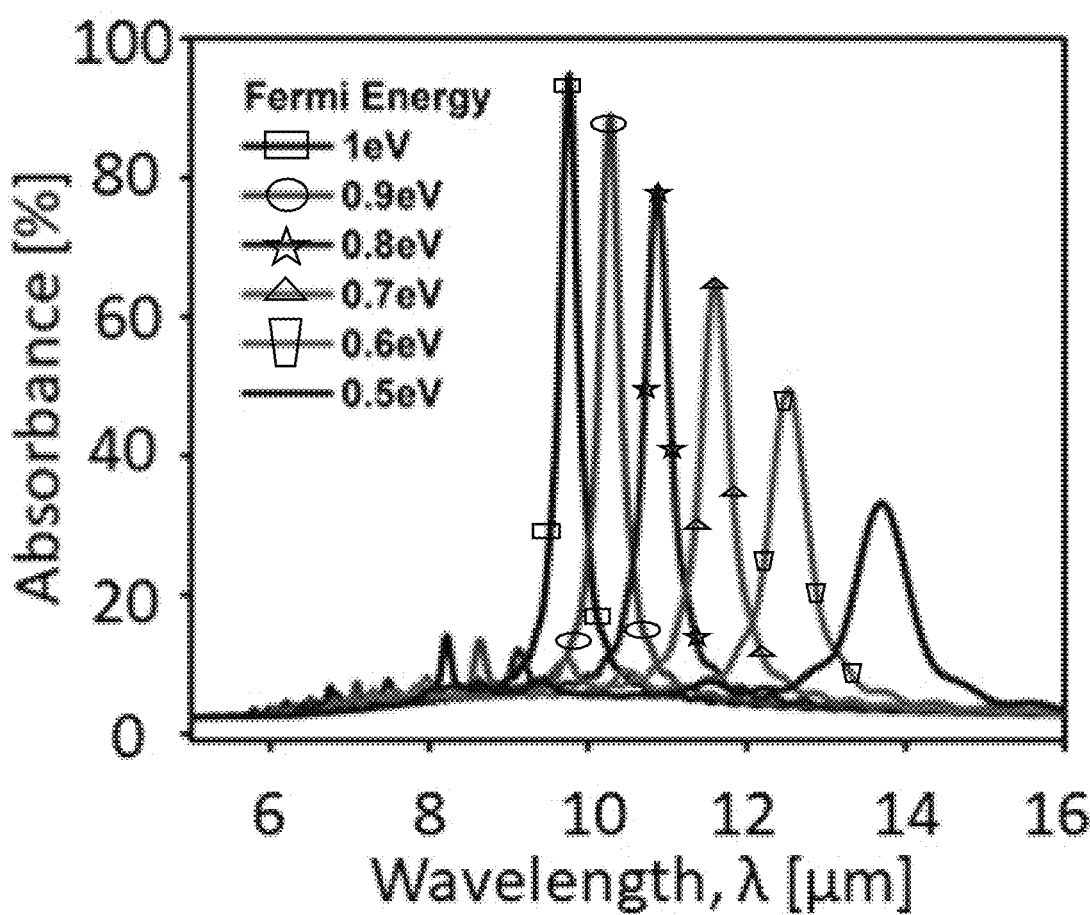
FIGS. 2A-2D are diagrams of absorbance in the IR photodetector, according to the present disclosure.
Figure 2B:
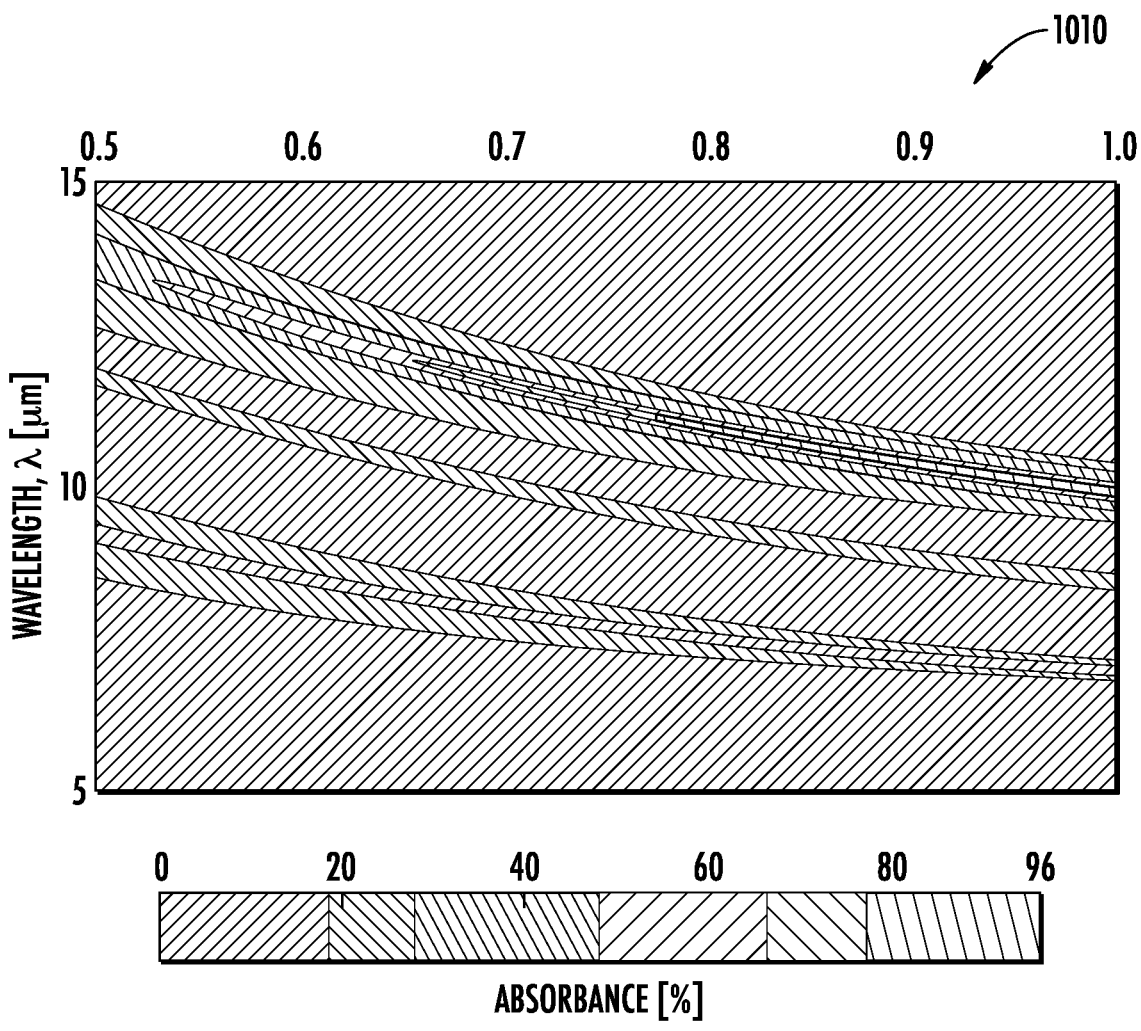
Figure 2C:
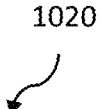
Figure 2C:
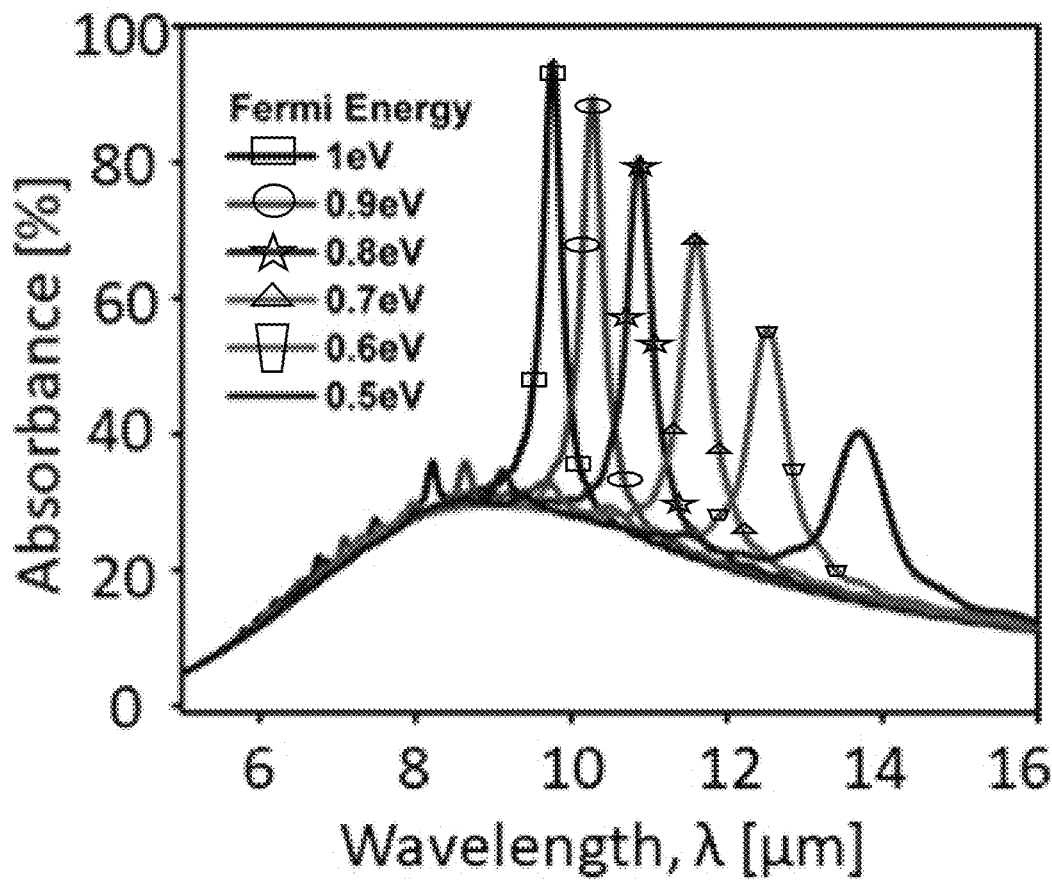
Figure 2D:
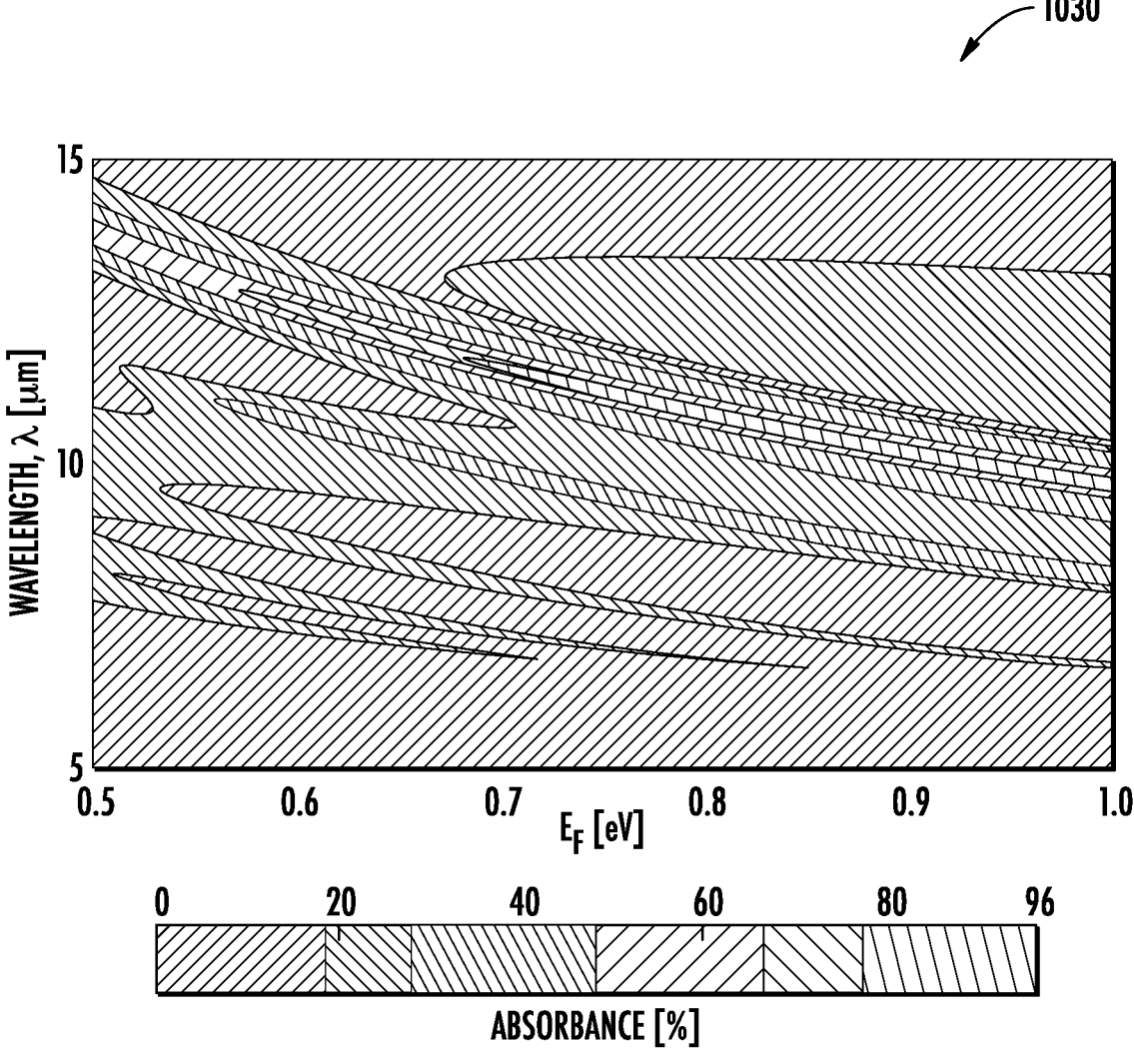

FIGS. 2A-2D show the absorbance and photocurrent of the NGP-VO₂ IR photodetector 100 shown in FIG. 1 with hexagonal nanopattern made of a hole diameter of 300 nm and a period of 450 nm. Diagram 1000 of FIG. 2A shows the absorbance when VO₂ is in the insulating phase, calculated by means of the finite-difference time-domain (FDTD) method. The resonance peaks of the localized surface plasmons (LSPs) are clearly visible and tunable by means of a gate voltage that shifts the Fermi energy inside the NPG sheet. Absorbance of mid-IR light in this wavelength regime in insulating VO₂ is very low. Diagram 1010 of FIG. 2B shows the absorbance as a function of wavelength and Fermi energy, showing the overall tunability of the LSP resonance peaks, when VO₂ is in the insulating phase. Diagram 1020 of FIG. 2C shows the absorbance of the NGP-VO₂ photodetector shown in FIG. 1 when VO₂ is in the metallic phase. The resonance peaks of the LSPs are still clearly visible. Compared with the absorbance for insulating VO₂ shown in diagram 1000 of FIG. 2A, the metallic VO₂ layer absorbs mid-IR light over a large wavelength regime and exhibits a maximum of about 30% at a wavelength of about λ=9 μm. FIG. 2D includes diagram 1030, which shows absorbance as a function of wavelength and Fermi energy, showing the overall tunability of the LSP resonance peaks, when VO₂ is in the metallic phase.

Figures 3A, 3B:
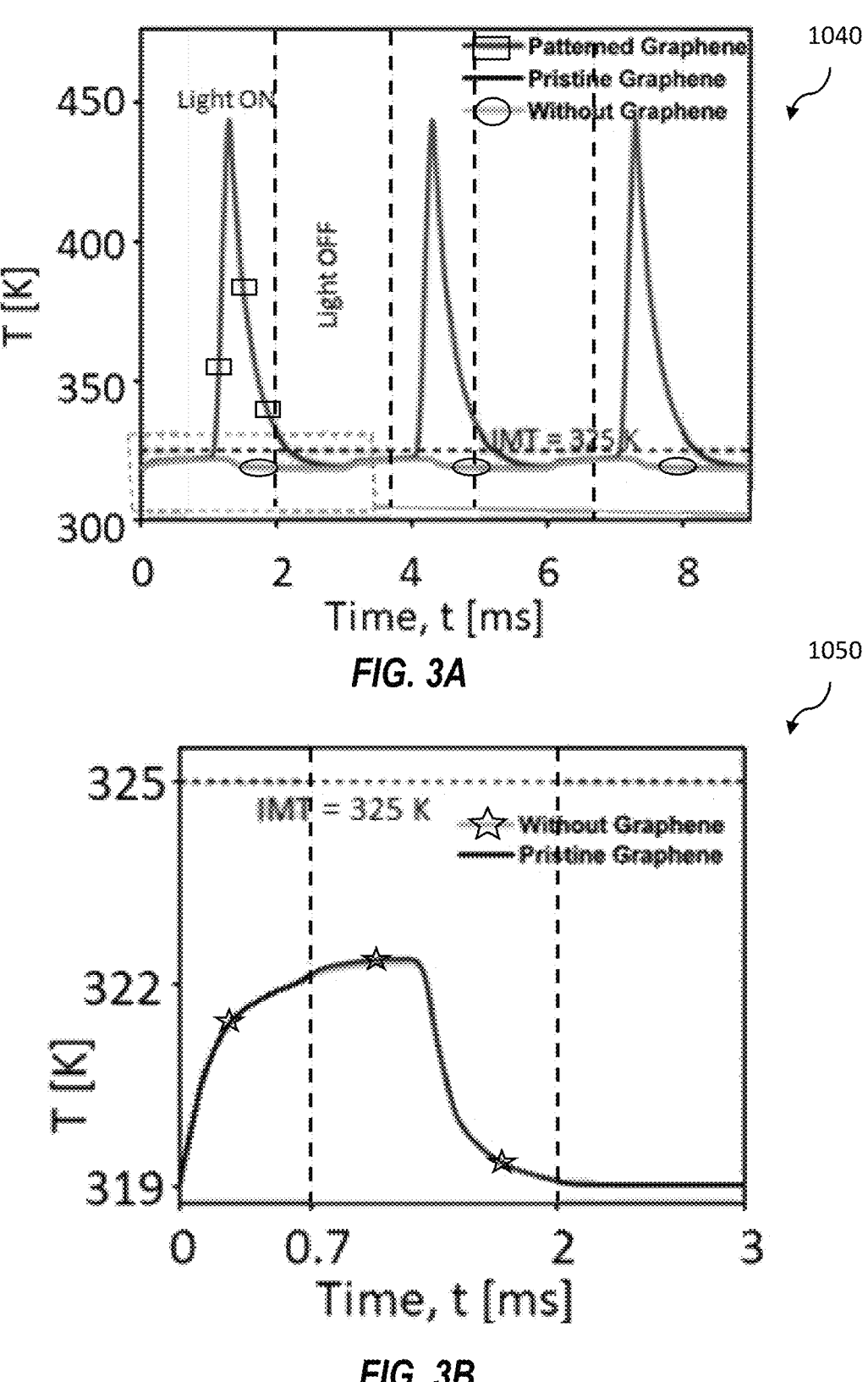
FIGS. 3A-3B are diagrams of temperature in the IR photodetector, according to the present disclosure.
Figure 3C:
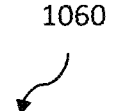
FIGS. 3C-3D are diagrams of photocurrent in the IR photodetector, according to the present disclosure.
Figure 3C:
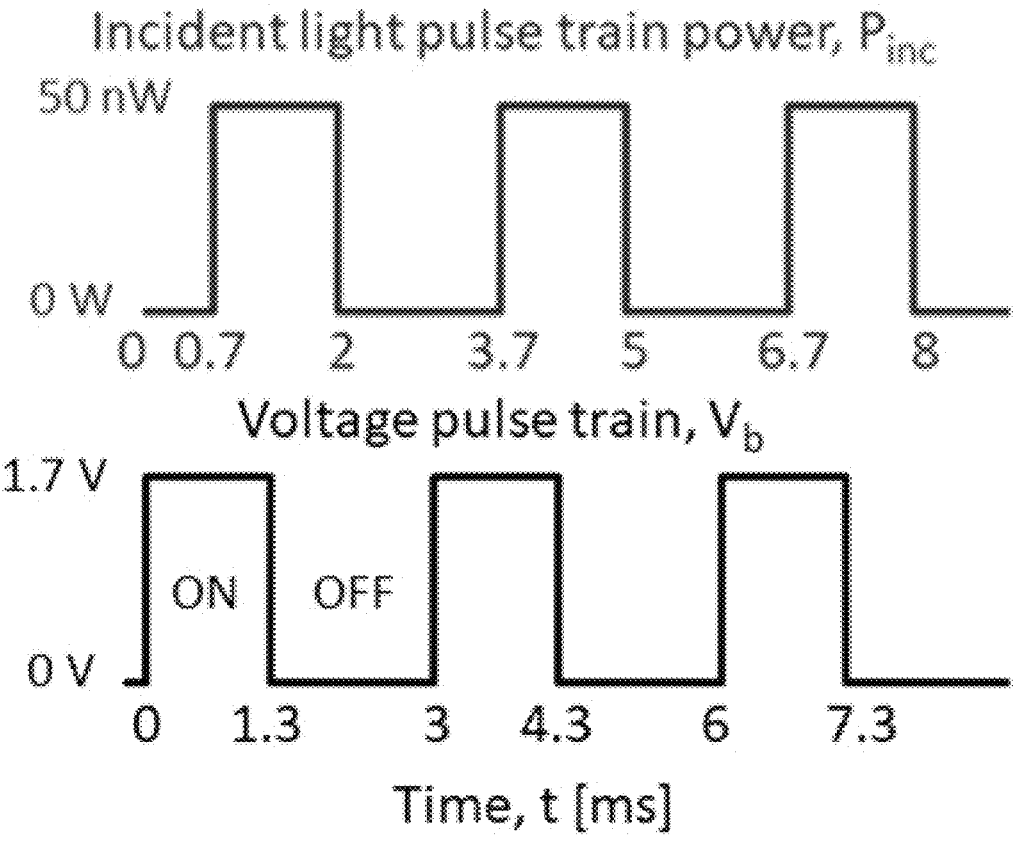
Figure 3D:
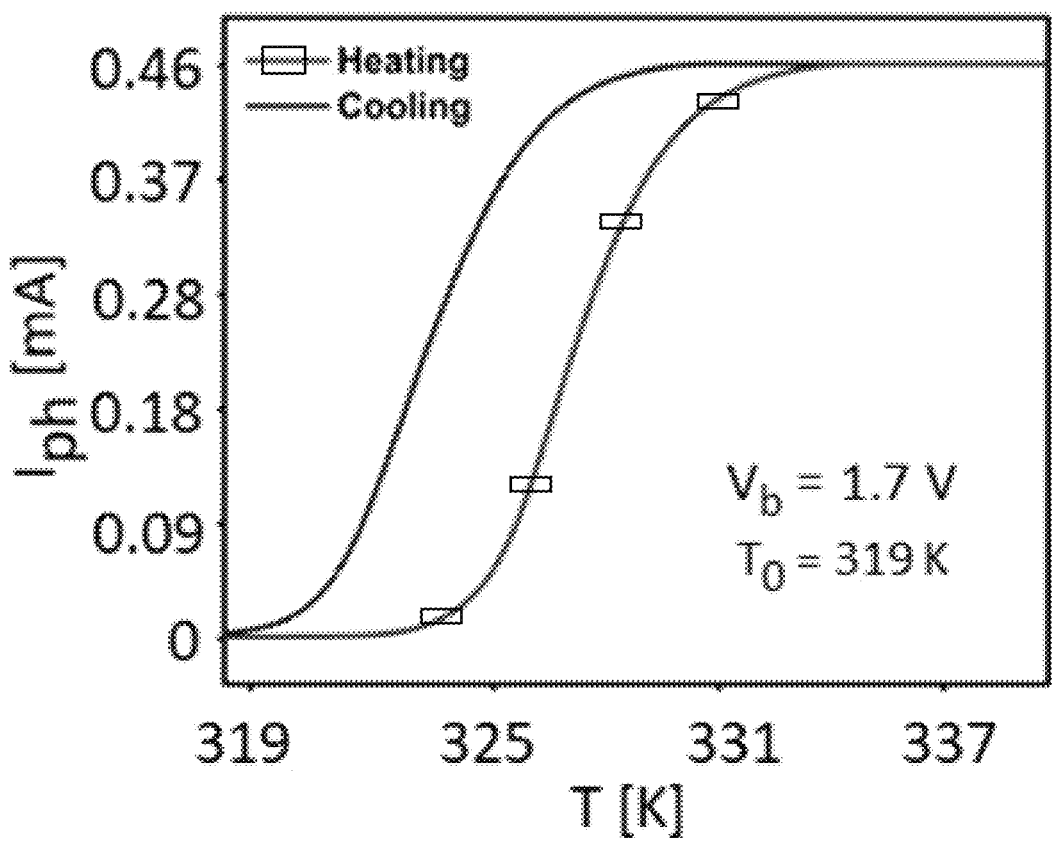
Figure 3E:
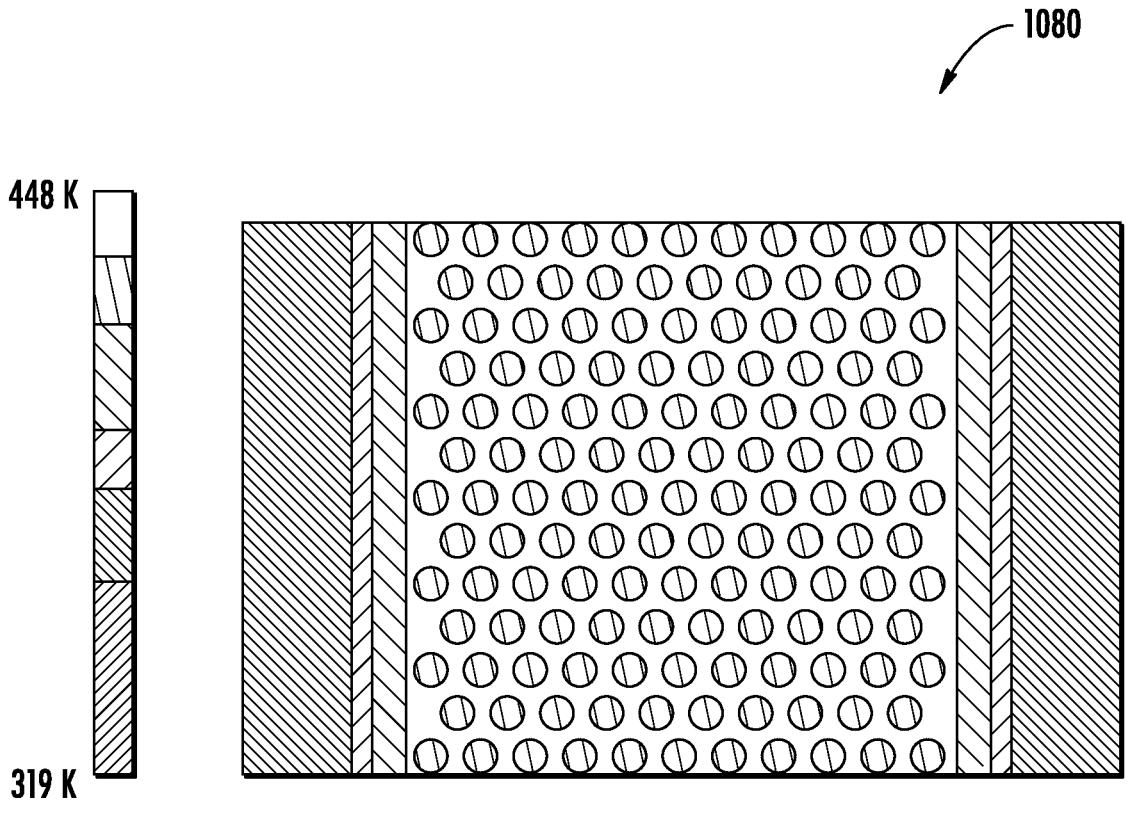
FIGS. 3E-3F are diagrams of temperature profiles in the IR photodetector, according to the present disclosure.
Figure 3F:
Figure 3F:
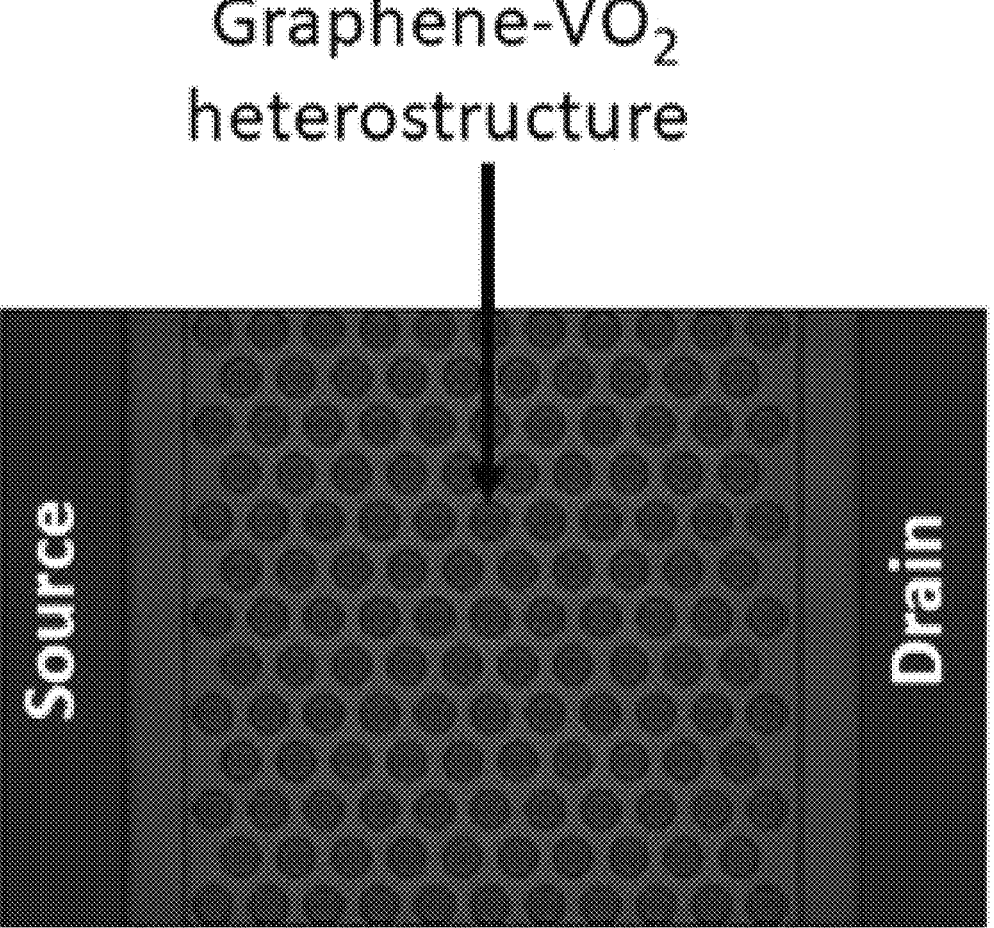

FIGS. 3A-3F include diagrams 1040, 1050, 1060, 1070, 108, & 1090, which show temperature and photocurrent as functions of temperature and time of the NGP-VO₂ photodetector shown in FIG. 1 with nanopattern made of a hole diameter of 300 nm and a period of 450 nm. FIG. 3A includes diagram 1040, which shows temperature T of the VO₂ layer as a function of time, showing the photodetection process while the incident mid-IR light is turned on periodically for 1.3 ms, and the applied bias voltages of $V_b$=1.7 V are turned on periodically for 1.3 ms, as shown in diagram 1060 of FIG. 3C. FIG. 3D includes diagram 1070, which shows photocurrent $I_{ph}$ through the VO₂ layer as a function of temperature T for a constant applied bias voltage $V_b$=1.7 V during the heating (red curve) and cooling (blue curve) process. The base temperature of the substrate is kept at $T_0$=319 K. The temperature difference of the hysteresis is ΔT=5 K. FIG. 3E includes diagram 1080, which shows a temperature profile at times t=1.2 ms when VO₂ is in the metallic phase. The maximum temperature is $T_{max}$=337 K. The gap between the NPG and the source and drain contacts ensures that there is no electrical current flowing through the NPG. FIG. 3F includes diagram 1090, which shows a temperature profile at times t=2.9 ms when VO₂ is in the insulating phase. The maximum temperature is $T_{max}$=319.2 K.

Figure 4:
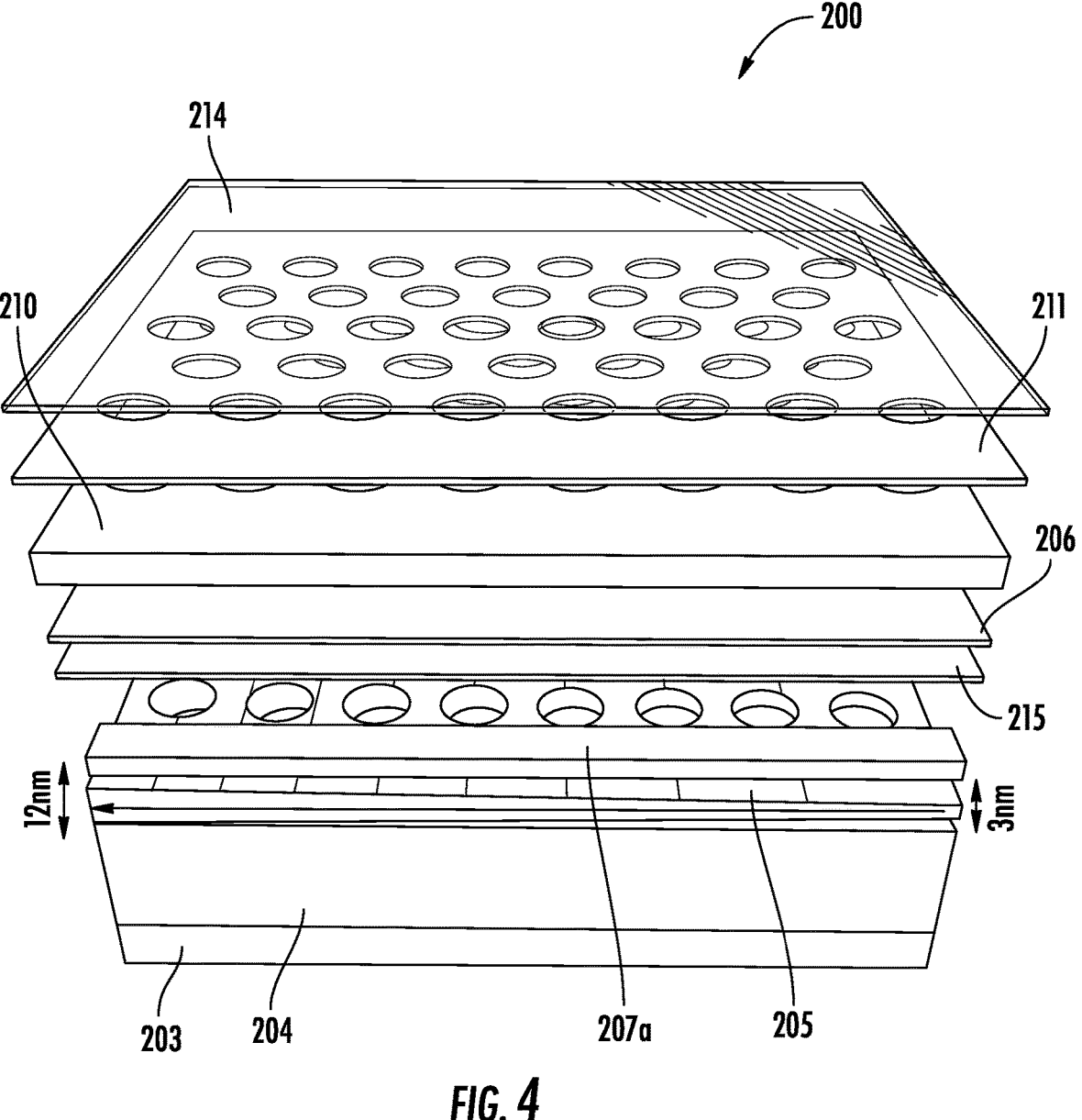
FIG. 4 is an exploded view of a second embodiment of the IR photodetector, according to the present disclosure.

FIG. 4 includes an IR photodetector 200 (NPG-VO₂ photodetector) with a VO₂ layer whose thickness has a gradient varying from 3 nm to 12 nm. Note that the gate voltage is applied by means of a gold contact (not shown) above h-BN.

Figure 5A:
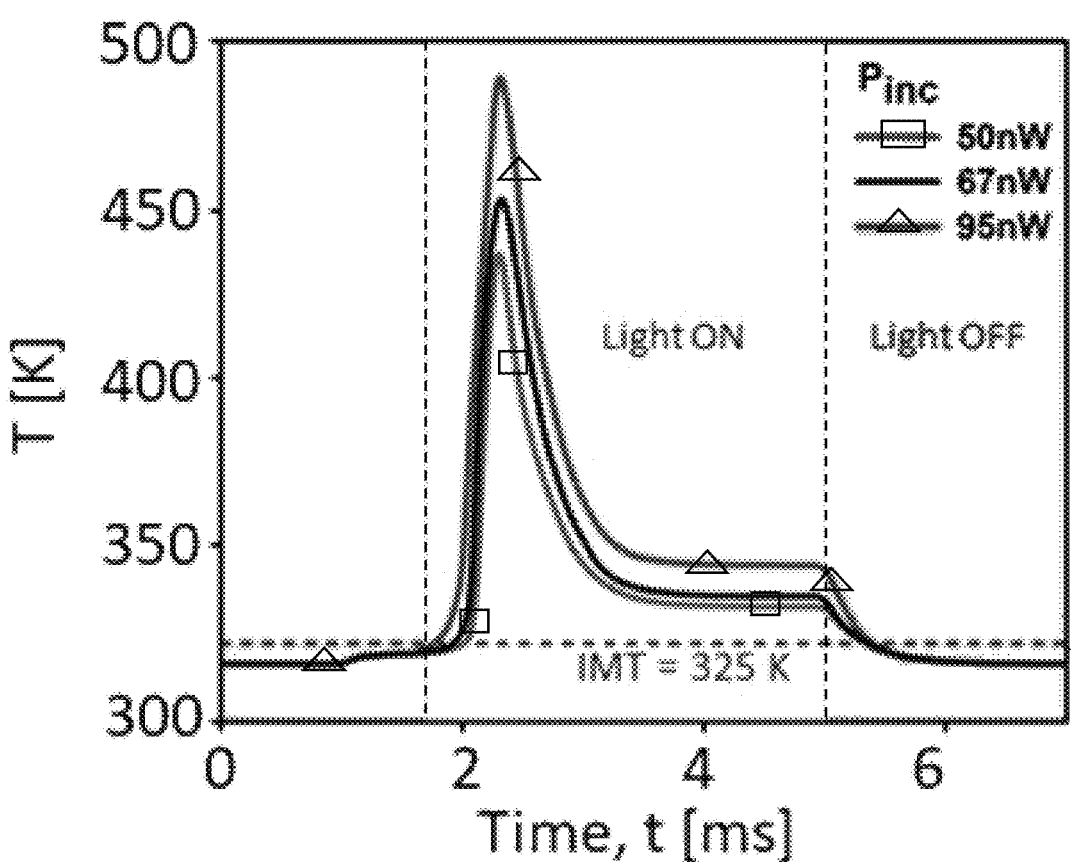
FIG. 5A is a diagram of temperature in the IR photodetector, according to the present disclosure.
Figure 5B:
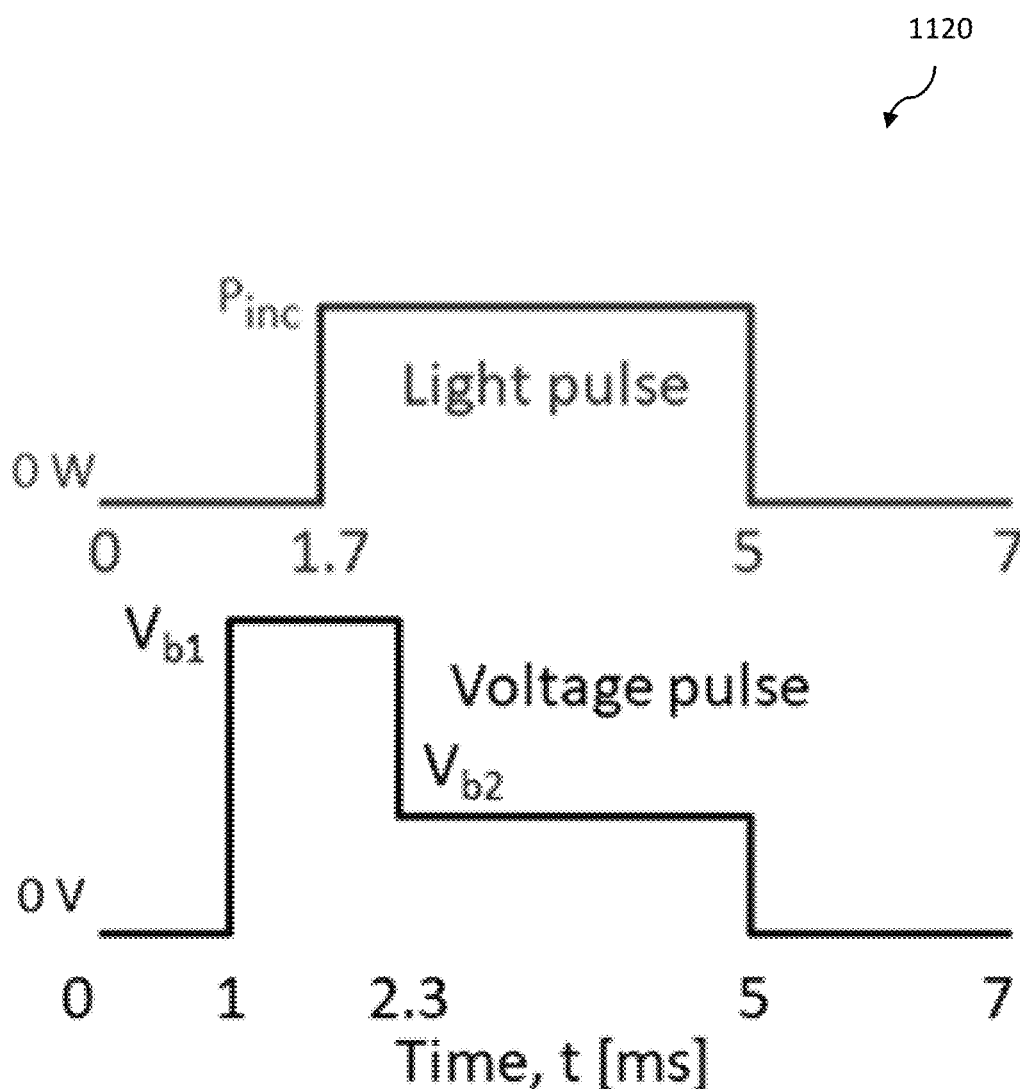
FIG. 5B is a diagram of bias current in the IR photodetector, according to the present disclosure.
Figure 5C:
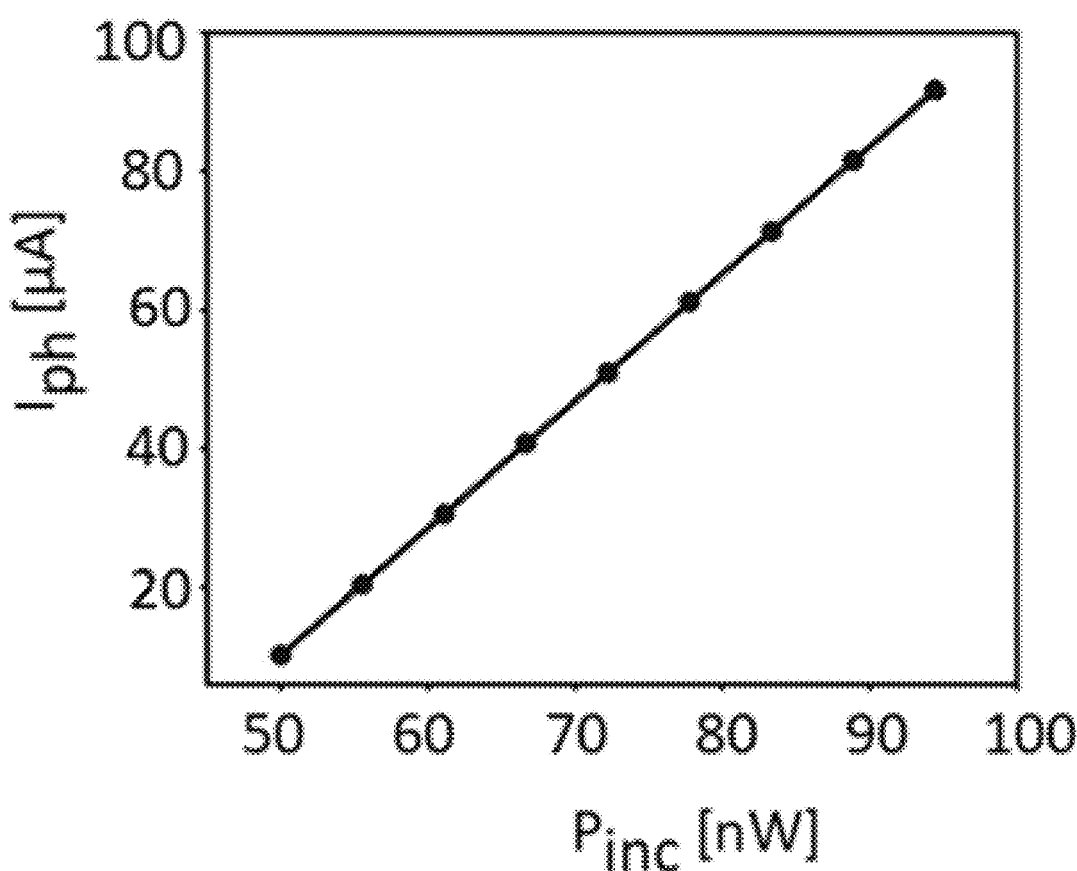
FIG. 5C is a diagram of photocurrent in the IR photodetector, according to the present disclosure.
Figure 5D:
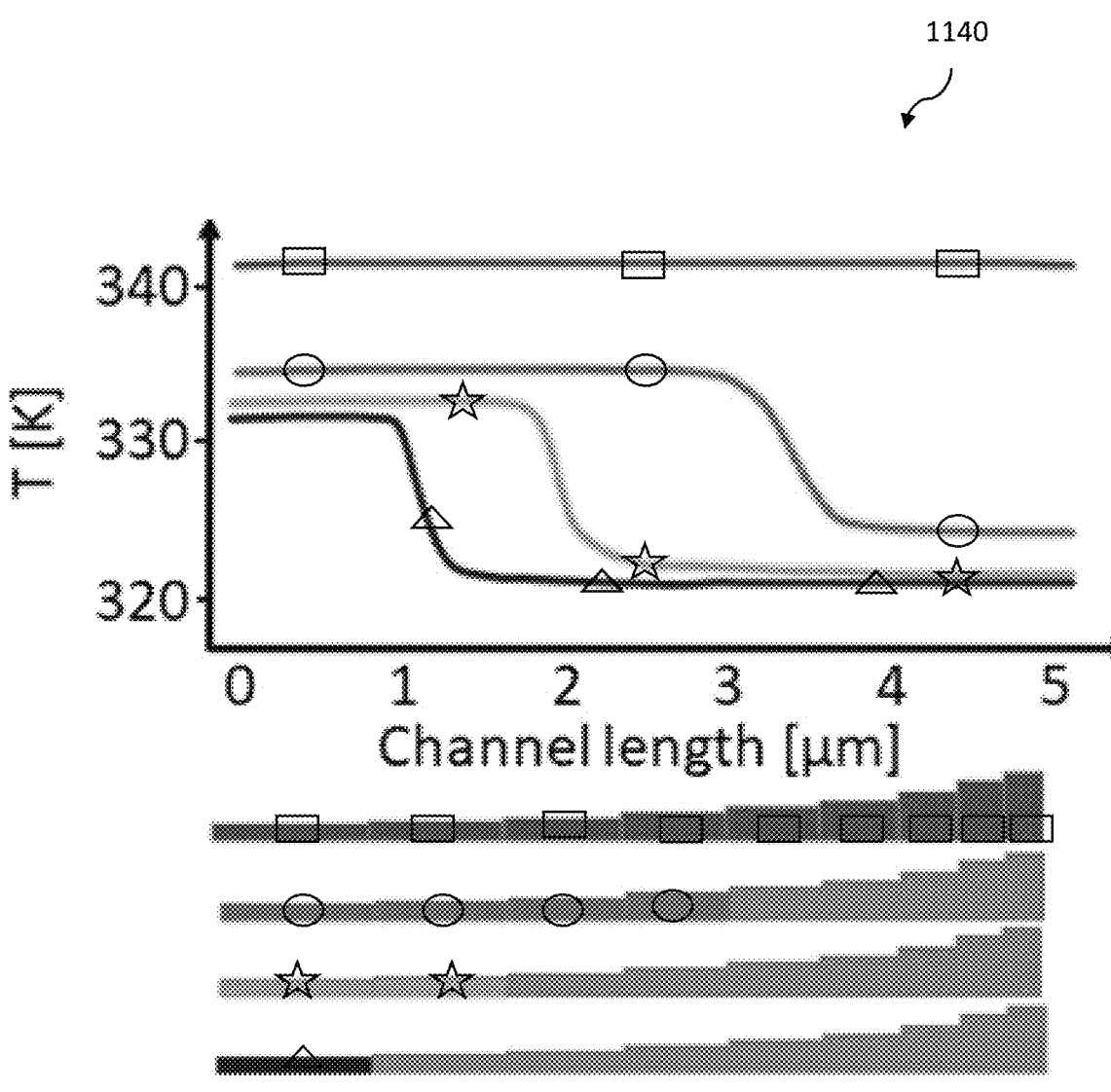
FIG. 5D is a diagram of temperature in the IR photodetector, according to the present disclosure.
Figure 5E:
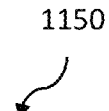
FIG. 5E is a diagram of temperature in the IR photodetector, according to the present disclosure.
Figure 5E:
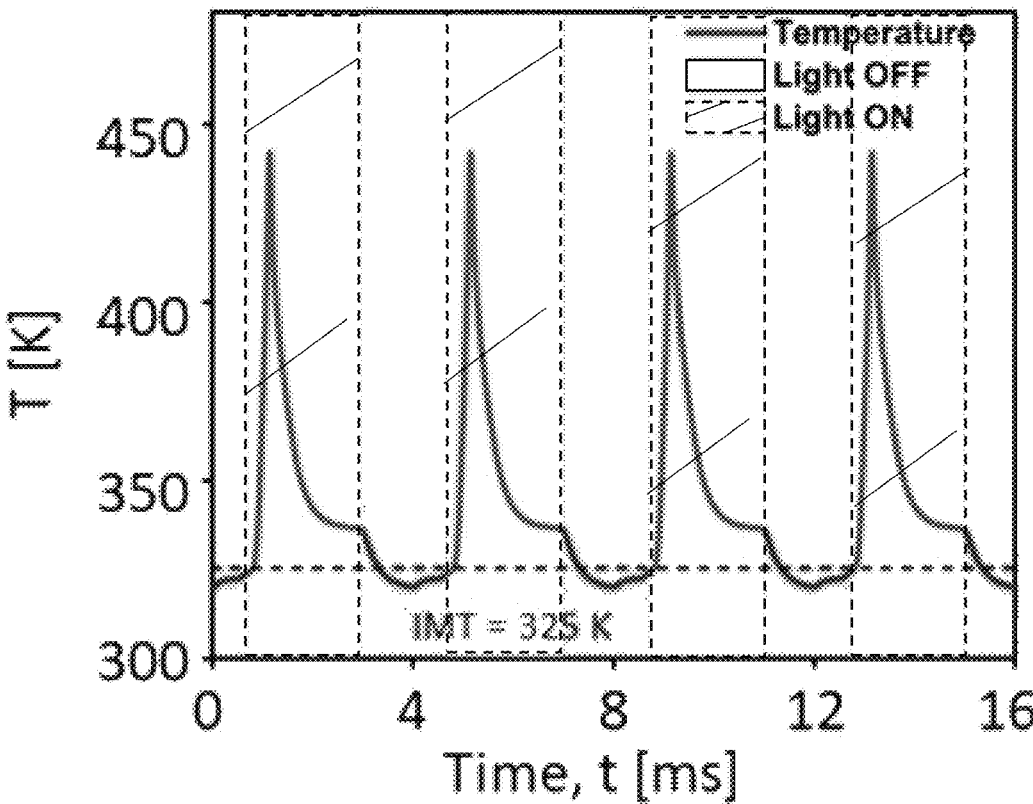
Figure 5F:
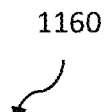
FIG. 5F is a diagram of a pulse train in the IR photodetector, according to the present disclosure.
Figure 5F:
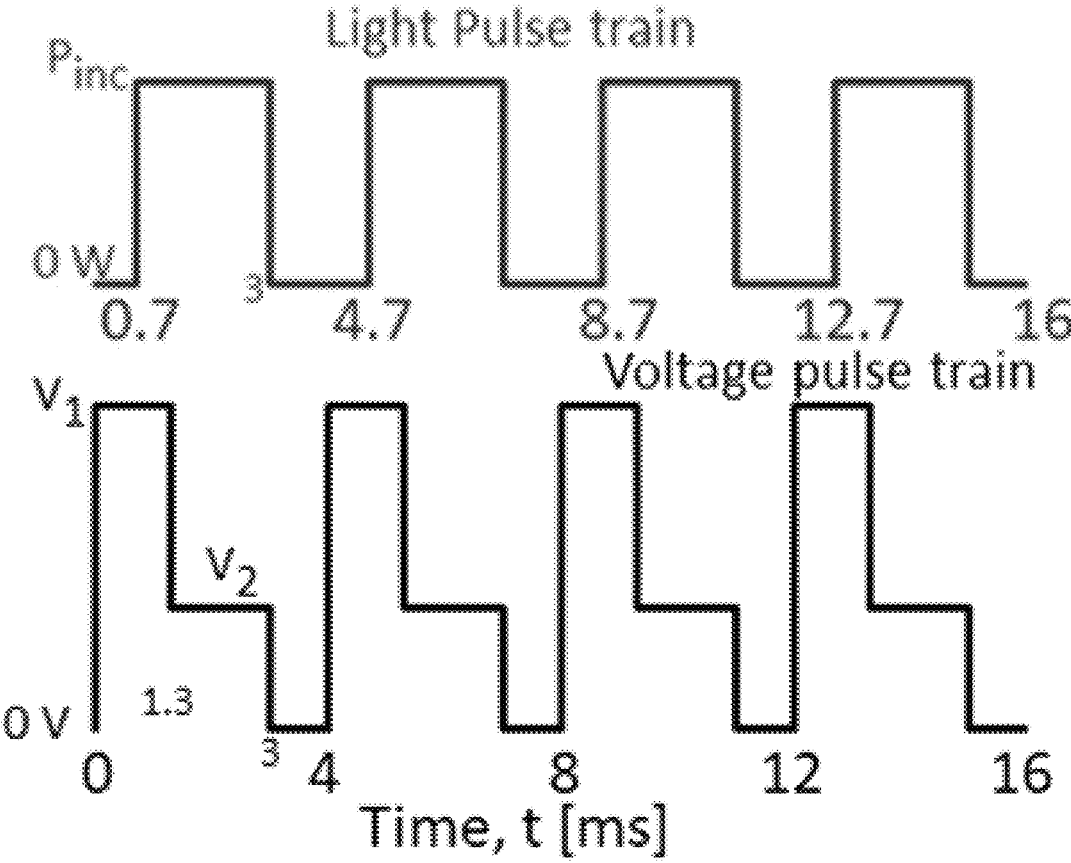

FIGS. 5A-5F include diagrams 1110, 1120, 1130, 1140, 1150, 1160, which show temperature and photocurrent as functions of temperature and time of the NGP-VO₂ photodetector shown in FIG. 1 with nanopattern made of a hole diameter of 300 nm and a period of 450 nm. FIG. 5A includes diagram 1110, which shows temperature T of the VO₂ layer as a function of time, showing the photodetection process while the incident mid-IR light is turned on periodically for 1.3 ms, and the applied bias voltages of $V_b$=1.7 V are turned on periodically for 1.3 ms, as shown in FIG. 5B. FIG. 5C includes diagram 1130, which shows photocurrent $I_{ph}$ through the VO₂ layer as a function of power of the incident light $P_{inc}$ for a constant applied bias voltage $V_b$=1.7 V during the heating (red curve) and cooling (blue curve) process. The base temperature of the substrate is kept at T0=319 K. The temperature difference of the hysteresis is ΔT=5 K. FIG. 5D includes diagram 1140, which shows four temperature profiles of the cross section of the VO₂ layer showing nine different thicknesses. The larger the power of the incident light $P_{inc}$, the more steps undergo the phase transition from insulating to metallic phase. This gradient of thickness gives rise to the linear photocurrent $I_{ph}$ as a function of $P_{inc}$, shown in FIG. 5C. FIG. 5E includes diagram 1050, which shows a temperature profile at times t=1.2 when VO₂ is in the metallic phase. The maximum temperature is $T_{max}$=337 K. FIG. 5F includes diagram 1160, which shows a temperature profile at times t=2.9 ms when VO₂ is in the insulating phase. The maximum temperature is $T_{max}$=319.2 K.

Figure 6:
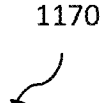
FIG. 6 is a diagram of responsivity in the IR photodetector, according to the present disclosure.
Figure 6:
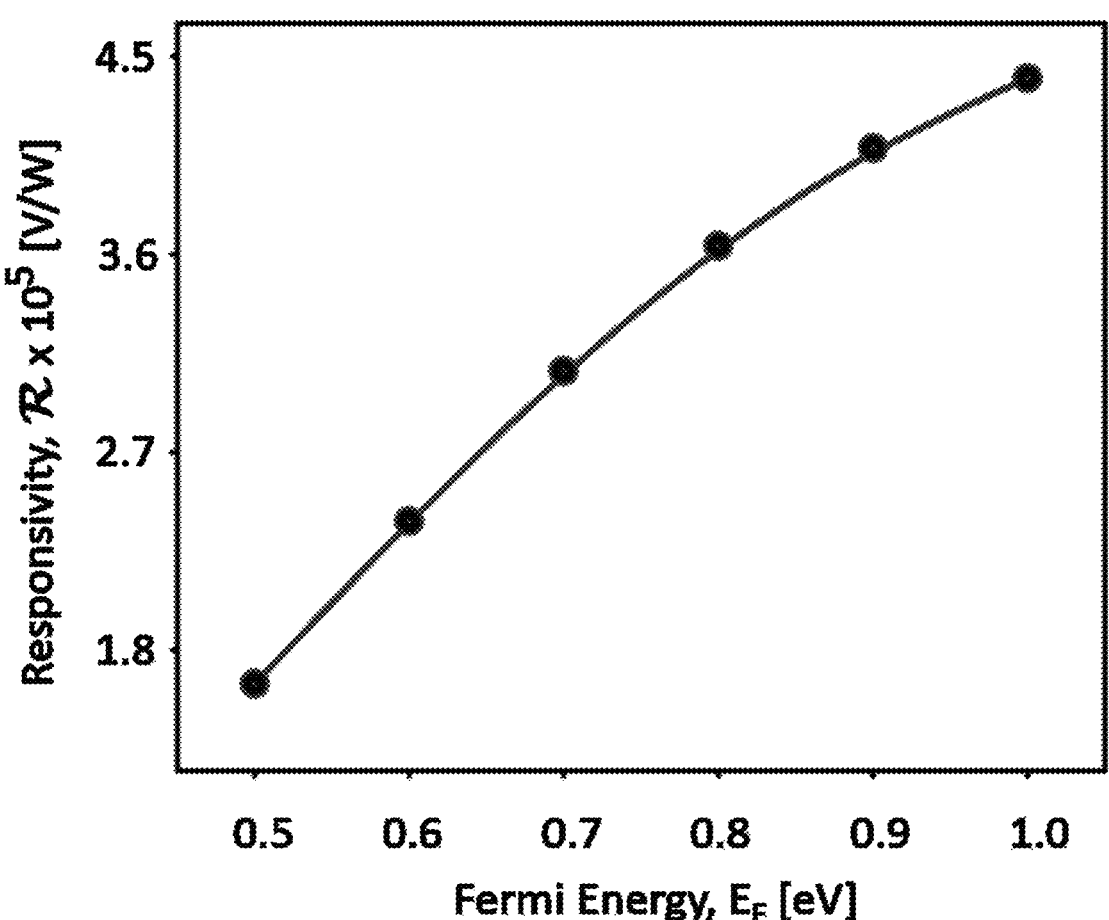

FIG. 6 includes diagram 1170, which shows responsivity of the IR photodetector 200 as a function of Fermi energy $E_F$ of the NPG. Due to the low photon energy of IR radiation, cryogenic cooling is required for highly sensitive photodetection based on low band gap materials like mercury-cadmium-telluride (HgCdTe). Various kinds of microbolometers primarily based on vanadium oxide (VO$_x$) offer uncooled detection of IR radiation. However, microbolometers suffer from low sensitivity, slow response and tedious multi-step complex lithographic processes in comparison to cooled photodetectors [1]. Photodetection based on the bolometric effect takes advantage of the dependence of the resistivity on the temperature to detect incident light, typically in the infrared regime.

Vanadium oxide (VO₂) is considered as one of the standard materials for building microbolometers with broadband MWIR photodetection because it features a reversible IMT when heated above the phase transition temperature $T_c$, which is slightly above and close to room temperature [2]. Bulk VO₂ undergoes a phase transition from an insulating state with monoclinic crystal structure below 68° C. to a metallic state with rutile crystal structure above T, =68° C. (=341 K) [3-5]. This phase transition is fully reversible with a hysteresis loop, occurs on a sub picosecond timescale [6, 7], and can be initiated either thermally, electrically [8], or optically [9]. While for bulk VO₂ optically induced IMT can only be achieved by pumping above the band gap of $E_g$=670 meV, it is possible to induce IMT in thin films at energies of 200 meV and above (corresponding to wavelengths of Λ=6.2 μm and below) due to electronic defects inside the band gap [10]. This is the reason why VO₂ thin films containing defects can be used for IR detection in a wide IR range, in particular in the 3-5 μm range. Interestingly, when VO₂ is in the form of a thin film, its transition temperature $T_c$ depends strongly on the thickness d of the film, i.e. $T_c$ decreases from 65° C. (=338 K) for d=25 nm down to 52° C. (=325 K) for d=3 nm [11]. While IR radiation with wavelengths above about Λ=1 μm cannot detect the change in thickness of around 20 nm, it certainly distinguishes between the insulating and the metallic phase of $VO_2$. All these properties make $VO_2$ the ideal material for developing MWIR photodetectors based on the IMT effect.

However, photodetection of MWIR light with wavelength above about 6 μm is inefficient with $VO_2$ bulk or thin films because of the relatively weak interaction between the incident photons and the optical phonons in $VO_2$. This interaction is so weak that the IMT cannot be achieved. That is why in the wavelength regime of 8 to 12 μm the photo-detection is based purely on the bolometric effect in the semiconducting phase of $VO_2$ [13, 14]. Advantageously, by adding a single layer of nanopatterned graphene (NPG) on top of a layer of $VO_2$, an IR photodetector 100, 200 is disclosed that not only greatly enhances the absorption of MWIR light energy in the longer wavelength regime from Λ=6 μm and exceeding 12 μm but also narrows the absorption bandwidth to 0.1 μm within the MWIR range of 3 to 12 μm, thereby enabling plasmonically enhanced spectrally selective absorption of MWIR light for the IMT effect in a heterostructure made of NPG and $VO_2$.

Described herein is a model of a MWIR microbolometer that includes a hexagonal boron nitride (h-BN) coated NPG, silicon nitride ($Si_3N_4$), indium tin oxide (ITO), $VO_2$, poly-mer, and gold (Au) mirror, as shown in the IR photodetector 100 in FIG. 1. The working principle of the IR photodetector 100, 200 can be summarized as follows. After MWIR photons get absorbed by the NPG sheet at a wavelength that matches the localized surface plasmon (P) resonance, the NPG's temperature increases and transfers the heat through the $Si_3N_4$ and ITO layers to the $VO_2$ layer. By patterning not only the graphene sheet but also the $Si_3N_4$ and ITO layers, the IR photodetector 100, 200 may maximize the heat transfer to the $VO_2$ layer. Once the $VO_2$ layer's temperature increases above the phase transition temperature $T_c$, the $VO_2$ layer undergoes a transition from insulating to metallic phase. The patterning of the $VO_2$ layer decreases its volume, thereby decreasing the heat required to drive the $VO_2$ layer over $T_c$, which in turn increases the sensitivity (NEP) of the IR photodetector 100, 200. During this whole time, a bias voltage $V_b$ is applied to the $VO_2$ layer, which upon phase transition triggers a current through the $VO_2$ layer, which can be detected electronically in about 1 ms, shorter than the detection time of typical $VO_2$ bolometers [14].

For the electronic response of the graphene sheet and the $VO_2$ layer to the incident MWIR photons, the intraband conductivity of graphene and the dielectric function of $VO_2$ in the insulating and metallic regimes is considered. Using the linear dispersion relation, the intraband optical conduc-tivity of graphene is [12, 18]

$$\sigma_{intra}(\omega) = \frac{e^2}{\pi\hbar^2}\frac{2k_BT}{\tau^{-1}-i\omega}\ln\left[2\cosh\left(\frac{E_F}{2k_BT}\right)\right], \tag{1}$$

which in the case of $E_F \gg kBT$ is reduced to $$\sigma_{intra}(\omega) = \frac{e^2}{\pi\hbar^2}\frac{E_F}{\tau^{-1}-i\omega} = \frac{2\varepsilon_m\omega_p^2}{\pi\hbar^2(\tau^{-1}-i\omega)}, \tag{2}$$

where τ is determined by impurity scattering and electron-phonon interaction $\tau^{-1}=\tau_{imp}^{-1}+\tau_{e-ph}^{-1}$. Using the mobility μ of the NPG sheet, it can be presented in the form $\tau^{-1}=ev^2F/(\mu E_F)$, where $V_F=10^6$ m/s is the Fermi velocity in graphene. $\omega_p=\sqrt{e^2E_F/2\varepsilon_m}$ is the bulk graphene plasma frequency.

Following Refs. 19 and 13, the dielectric function of $VO_2$ can be modeled by means of a Drude Lorentz model for the insulating phase, $$\epsilon_i=\epsilon\infty \tag{3}$$

where j=1, . . . , N denotes the N phonon modes, $\omega_j$ are the phonon vibration frequencies, $y_j$ are the scattering rates, and $S_j$ are the oscillation strengths. The value of these parameters can be found in Ref. 13. The metallic phase of $VO_2$ can be modeled by means of the Drude formula, $$\epsilon_m(\omega) = \epsilon_\infty - \frac{\Omega_p^2}{\omega(\omega+i\Gamma)}\left(1+\frac{ic\Gamma}{\omega+i\Gamma}\right), \tag{4}$$

where $\Omega_p=N_f e^2/_0m^*=8000$ cm$^{-1}$ is the plasma frequency, $\Gamma=e/m^*.\mu_{VO2}=10000$ cm$^{-1}$ is the collision frequency, with $\mu_{VO2}=2$ cm$^2$/Vs being the mobility, $N_f=1.3\times10^{22}$ cm$^{-3}$ the free-carrier concentration, and m*=$2m_e$ the effective mass of the charge carriers. $m_e$ is the free electron mass.

The finite-difference time domain method (FDTD) is used to calculate the absorbance of the hybrid IR photodetector 100, 200 as shown in diagram 1000 of FIG. 2A when $VO_2$ is in the insulating phase and in diagram 1020 of FIG. 2C when $VO_2$ is in the metallic phase. The resonance peaks due to the absorption of MWIR light by localized surface plasmons ($P_s$) in NPG are clearly visible and similar to previous reports [12, 15-17]. The main difference is that the $VO_2$ layer exhibits very low absorbance (around 6%) of MWIR light in the insulating phase but a larger broadband absorption in the metallic phase. The thicker the metallic $VO_2$ layer is, the stronger is the absorption of MWIR light. A $VO_2$ layer thickness of 3 nm is used for two important reasons. Firstly, a thinner $VO_2$ layer results in weaker absorption and thus makes it easier for the photodetector to cool down after the incident MWIR radiation is turned off. Secondly, the thinner $VO_2$ layer has a lower phase transition temperature of $T_c=52°$ C. (=325 K) and thus requires less external heating for keeping the photodetector at an opti-mum operating temperature (see below).

The absorbance resonance peak as a function of wave-length can be tuned by means of the Fermi energy of NPG, as shown in diagram 1010 of FIG. 2B when $VO_2$ is in the insulating phase and in diagram 1030 of FIG. 2D when $VO_2$ is in the metallic phase. Thus, the gate voltage allows the operating wavelength of the IR photodetector 100, 200 to be tuned.

For modeling the operation of the IR photodetector 100, 200, COMSOL is used, and the following theory for the thermoelectric properties of $VO_2$ close to the phase transi-tion temperature $T_c$. The $VO_2$ layer is operated around the IMT phase transition temperature $T_c$. The performance of the bolometric detection can be analyzed by means of the heat equation and a hysteresis model [21]. The heat equation reads $$C\frac{dT}{dt} = \alpha P + I^2R(T) - G(T-T_h), \tag{5}$$

where C is the heat capacity, $\alpha$ is the absorbance, P is the power of the incident radiation, I is the time-independent bias current, R(T) is the temperature-dependent resistance, G is the thermal conductivity of the heat sink, and $T_h$ is the time independent temperature of the heat sink. The hysteretic behavior of R(T) for $VO_2$ layer can be calculated by $$R(T) = 17\exp\left(\frac{2553}{T+273}\right)g(T) + 140, \tag{6}$$

where the semiconductor volume fraction is given by $$g(T) = \frac{1}{2} + \frac{1}{2}\tanh\beta\left[\delta\frac{w}{2} + T_c - \left(T + T_{pr}P\left(\frac{T-T_r}{T_{pr}}\right)\right)\right], \tag{7}$$

where w is the width of the hysteresis, $\beta$ is a function of dg/dT at $T_c$, P (x) is an arbitrary monotonically decreasing function, and $\delta$=sign (dT/dt). The proximity temperature is given by $$T_{pr} = \delta\frac{w}{2} + T_c - \frac{1}{\beta}\arctan h(2g_r - 1) - T_r. \tag{8}$$

Equations (5)-(8) describe the hysteretic behavior of the plasmonically driven bolometric photodetector. The incident power $P_{inc}$ is then given by the energy pumped into the plasmonic nanostructure.

Using this thermoelectric theory and combining it with our FDTD results, a photothermoelectric theory of the NPG-$VO_2$ heterostructure for the IR photodetector 100, 200 is provided. The geometry of the IR photodetector 100, 200 is optimized in terms of performance. A channel width of 5 μm (distance between the source and drain contacts) and a channel length of 5 μm are chosen. The larger the channel length, the smaller is the resistance of the $VO_2$ channel, resulting in reduced Joule heating. This is the method used to reduce the resistance instead of increasing the thickness of the $VO_2$ layer, which would increase the absorption of the $VO_2$ layer in the metallic phase. For the initial study, a thickness of 3 nm is used. Note that the current flows only through $VO_2$, not through NPG. NPG is used only as a photothermoelectric heating element. When the incident MWIR light is off, a very weak dark current I on the scale of μA is flowing when a bias voltage $V_b$ is applied in the range from 0.1 to 1.7 V. In stark contrast, when the incident MWIR light is on, a much larger light current I on the scale of mA is flowing with the same applied bias voltage $V_b$. This effect is due to the phase transition of $VO_2$ between insulating and metallic phases. Using the advantage of this effect, the model of an ultrasensitive photodetector based on the NPG-$VO_2$ heterostructure is developed.

After modeling the heating and cooling of the NPG-$VO_2$ heterostructure as a function of time, the optimum photodetection process may be identified. Diagrams 1040, 1050 in FIGS. 3A & 3B show the temperature T of the $VO_2$ layer as a function of time resulting from the incident light and voltage pulse trains depicted in FIG. 3C. The voltage pulse train is required to let the $VO_2$ layer cool down after each signal detection, i.e. it ensures the cooling of the photodetector below the phase transition temperature $T_c$, as shown in diagrams 1080, 1090 of FIGS. 3E and 3F. The amplitude of the voltage pulse train is set at a relatively high value of $V_b$=1.7 V in order to maximize the photoresponsivity R, detectivity D\*, and sensitivity NEP.

Diagram 1050 shows an enlarged portion of diagram 1080, which comprises a magnification between times t=0 ms and t=3 ms in order to demonstrate that the temperature increase of $VO_2$ with pristine graphene or without graphene is not sufficient to trigger an IMT in $VO_2$. This means that NPG may be necessary for triggering the IMT in $VO_2$. The photocurrent $I_{ph}$ through the $VO_2$ layer as a function of temperature T for a constant applied bias voltage $V_b$=1.7 V exhibits the expected hysteresis loop as shown in diagram 1080 of FIG. 3D. The theoretical models and experimental values of conductivity, thermal conductivity, and heat capacity of $VO_2$ were derived from Refs. [22-25]. The results reveal that the IR photodetector 100, 200 has a response time on a time scale of the order of 1 ms, shorter than current microbolometers based on $VO_2$ alone [14]. The temperature profiles shown in FIGS. 3E-3F reveal the stark contrast between the heating in the metallic phase and the insulating phase of $VO_2$, respectively.

Since it is desirable to realize a linear dependence of the photocurrent $I_{ph}$ as a function of input power Pi. of the MWIR light, a gradient in the thickness of the $VO_2$ layer is added, as shown in the IR photodetector 200 of FIG. 4, i.e. the $VO_2$ layer thickness is varied from 3 nm to 12 nm. FIGS. 5A-5D show four temperature profiles (diagram 1110, 1120, 1130, 1140) of the cross section of the $VO_2$ layer showing nine different thicknesses. The main idea is based on the fact that the larger the power of the incident light $P_{inc}$, the more steps undergo the phase transition from insulating to metallic phase, which results in a larger photocurrent $I_{ph}$. After modeling the heating and cooling of the NPG-$VO_2$ gradient heterostructure as a function of time, the optimum photodetection process may be identified. The widths and thicknesses of the steps are chosen such that total resistance of step remains the same, i.e. the resistance is R=$\rho$w/A, where $\rho$ is the resistivity of $VO_2$ and w is the channel width. The cross-sectional area A=$l_d$, where 1 is the length of a step and d is its thickness. This geometry gives rise to a photocurrent $I_{ph}$ that is linear as a function of $P_{inc}$. In particular, it was found that the voltage pulse train may comprise pulses with two applied bias voltages $V_{b1}$ and $V_{b2}$, where the former is responsible for the triggering of the IMT in $VO_2$ and the latter is substantially lower than the former in order to reduce the Joule heating and to ensure the linear dependence of $I_{ph}$ as a function of input power $P_{inc}$. Diagram 1110 of FIG. 5A shows the temperature T of the $VO_2$ layer as a function of time t resulting from the incident light pulse and a voltage pulse depicted in diagram 1120 of FIG. 5B. As before, the voltage pulse train is required to let the $VO_2$ layer cool down after each signal detection, i.e. it ensures the cooling of the photodetector below the phase transition temperature Th. The amplitude of the first part of the voltage pulse is set at a relatively high value of $V_{b1}$=1.7 V in order to maximize the photoresponsivity R, detectivity D\*, and sensitivity NEP, and the second part of the voltage pulse is set to the substantially lower value of $V_{b2}$=0.2 V in order to reduce Joule heating. Therefore, it is possible to operate the IR photodetector 100, 200 in pulse train mode, as shown in diagram 1160 of FIG. 5F. The dependence of the temperature T of the $VO_2$ as a function of incident light power is depicted by means of several graphs for $P_{inc}$=50 nW, 67 nW, and 95 nW. Owing to the thickness gradient of the $VO_2$ layer, the linear photocurrent $I_{ph}$ is obtained as a function of input power $P_{inc}$, as shown in diagram 1130 of FIG. 5C. This provides an optimized mapping of $P_{inc}$ onto $I_{ph}$ for maximum dynamic range.

The responsivity R of the IR photodetector 100, 200 can be calculated by means of the formula [16]

$$\mathcal{R} = \frac{(I_{light} - I_{dark})R}{P_{inc}}, \tag{9}$$

where R is the resistance of $VO_2$ in the metallic phase, $I_{light}$ is the light current when the incident light is on, $I_{dark}$ is the dark current when the incident light is off, and $P_{inc}$ is the power of the incident light. The responsivity as a function of Fermi energy $E_F$ of NPG is shown in diagram 1170 of FIG. 6. The sensitivity of the IR photodetector 100, 200 is determined by the noise-equivalent power (NEP), being an important figure of merit for the performance of a photodetector. The NEP of a photodetector provides a measure for the minimum detectable power per 1 Hz of bandwidth. The formula for NEP reads [16]

$$NEP = \frac{v_n}{\mathcal{R}}, \tag{10}$$

where $$v_n = \sqrt{v_t^2 + v_b^2 + v_f^2}, \tag{11}$$

is the root-mean-square of the total noise voltage, which consists of the sum over all possible noise voltages, such as the thermal Johnson-Nyquist noise $v_t$, due to thermal motion of the charge carriers and independent of the bias voltage $V_b$, the shot noise $V_b$, due to the discrete nature of uncorrelated charge carriers, and the 1/f noise $v_f$, also called flicker noise, due to random resistance fluctuations. The Johnson noise is given by [26]

$$v_t = \sqrt{4k_B TR}, \tag{12}$$

where $k_B$ is the Boltzmann constant, T is the temperature, and R is the resistance. The shot noise is given by [26]

$$v_b = \sqrt{2eI_d R^2}, \tag{13}$$

where e is the elementary charge and Id is the dark current. Since the dark current is very low and the IR photodetector 100, 200 operates close to room temperature, the shot noise is much smaller than the Johnson noise. Therefore, it is possible to safely neglect the shot noise. At a modulation frequency of $V_b$ of around 1 kHz, it is possible to also neglect the 1=f noise. Using the NEP, the detectivity of the IR photodetector 100, 200 is calculated by means of the formula [16]

$$D^* = \frac{\sqrt{A}}{NEP}, \tag{14}$$

where A is the area of the photodetector. The results of these figures of merit are shown in Table I.

TABLE I

| Figures of Merit of the NPG-VO₂ gradient photodetector at a Fermi energy of $E_F$ = 1.0 $E_v$ | | | | | |
|---|---|---|---|---|---|
| ΔT [K] | P [μW] | $T_0$ [K] | $\mathcal{R}$ [V/W] | NEP [fW/√Hz] | D* [Jones] |
| 5.0 | 18.0 | 315.0 | $1.1 \times 10^4$ | 347 | $0.50 \times 10^{10}$ |
| 3.0 | 14.0 | 317.0 | $1.4 \times 10^4$ | 273 | $0.64 \times 10^{10}$ |
| 1.2 | 10.6 | 318.8 | $1.9 \times 10^4$ | 203 | $0.85 \times 10^{10}$ |

10

Table I shows that the detectivity D* of the IR photodetector 100, 200 operating close to room temperature is close to D* of cryogenically cooled HgCdTe photodetectors. The IR photodetector 100, 200 reaches a sensitivity close to $VO_2$ microbolometers while exhibiting a shorter detection time of around 1 ms and being able to detect photons also in the LWIR regime, which is impossible for $VO_2$ microbolometers.

In conclusion, the model of an ultrasensitive MWIR photodetector based on a heterostructure made of NPG and $VO_2$ is provided, thereby extending the responsivity of a $VO_2$ microbolometer to the LWIR domain. Moreover, this hybrid IR photodetector 100, 200 has a narrowband absorption in the MWIR and LWIR that can be tuned by means of a gate voltage. Our results show that the IR photodetector 100, 200 can reach a large responsivity R~$10^4$ V/W, a detectivity D~$10^{10}$ Jones, and a sensitivity in terms of NEP, NEP~10 fW/sqrt(Hz) close to room temperature by taking advantage of the phase change of a thin $VO_2$ layer. The NPG sheet achieves an absorption of nearly 100% due to LSPs around the patterned circular holes in a hexagonal lattice symmetry. The electrostatic gate potential can be used to tune the wavelength peak in the MWIR and LWIR regimes between 3 and 12 microns, thereby overcoming the intrinsic upper limit of 6 microns for microbolometers based on $VO_2$. COMSOL simulations show that the IR photodetector 100, 200 is able to operate on a time scale of 1 ms, much shorter than the response times of current microbolometers based on $VO_2$ alone. The IR photodetector 100, 200 reaches detectivities of cryogenically cooled HgCdTe photodetectors and sensitivities close to and field of view similar to $VO_2$ microbolometers while operating close to room temperature.

Figure 7:
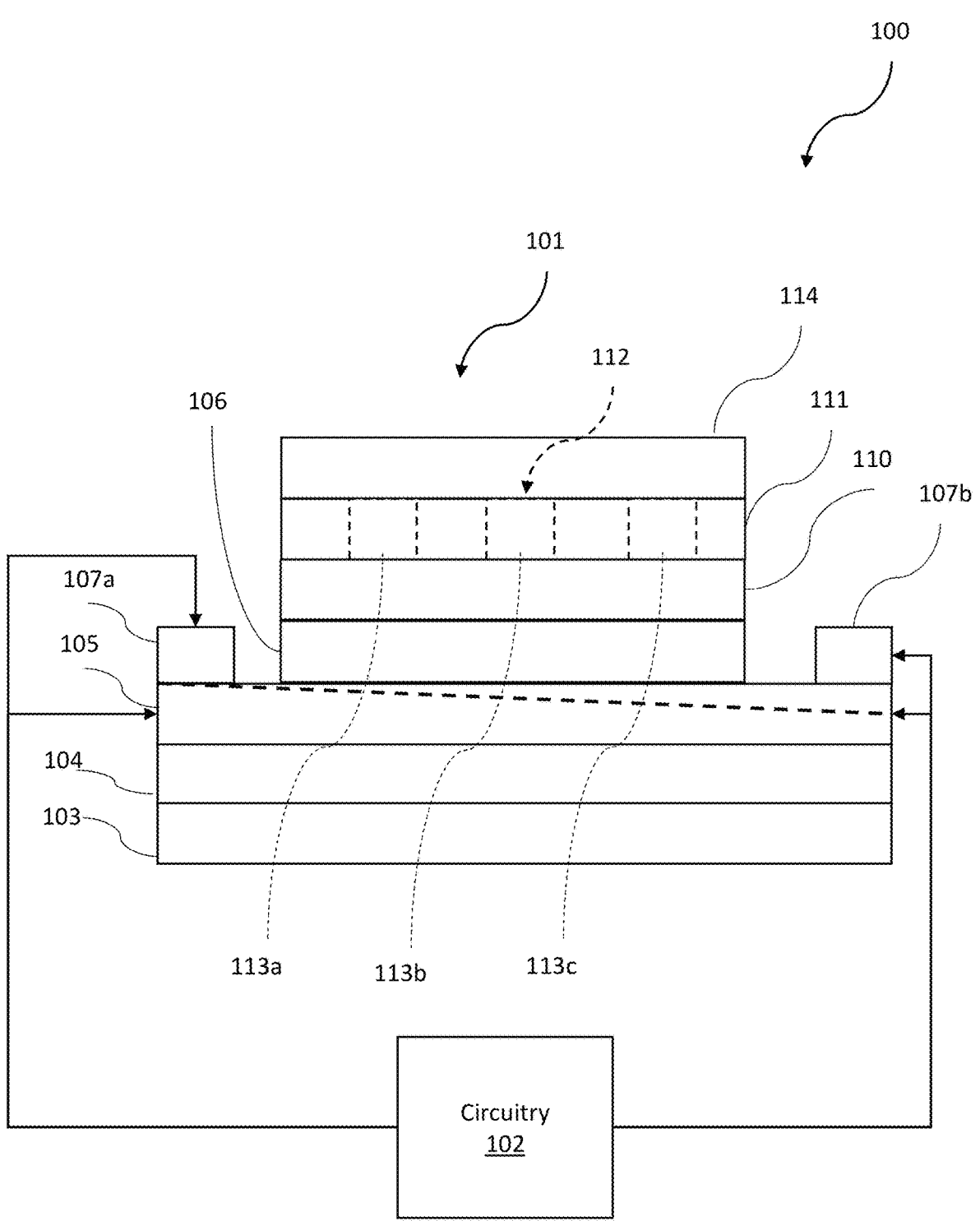
FIG. 7 is a schematic side view of the IR photodetector from FIG. 1.

Referring now to FIGS. 1 & 7, an IR photodetector 100 according to the present disclosure is now described. The IR photodetector 100 includes an electrically conductive layer 103, a first dielectric layer 104 over the electrically conductive layer, and a phase change material layer 105 over the first dielectric layer. The first dielectric layer 104 may comprise a polymer layer, such as SU-8. The electrically conductive layer 103 is a mirror layer, and may comprise one or more of gold, silver, and platinum.

The IR photodetector 100 illustratively includes first and second electrically conductive contacts 107a-107b coupled to the phase change material layer 105. Each of the first and second electrically conductive contacts 107a-107b may comprise one or more of gold, silver, platinum, copper, and aluminum.

The phase change material layer 105 may comprise vanadium oxide ($VO_x$), for example. Of course, other phase change materials may be used, but the vanadium oxide embodiment is helpful due to the room temperature phase change property. In some embodiments, the phase change material layer 105 may have a thickness gradient, which is shown with the dashed line in FIG. 7. In particular, the phase change material layer 105 has a first height value at a first end of the IR photodetector 100 adjacent the first electrically conductive contact 107a, and a second height value at a second end of the IR photodetector 100 adjacent the second electrically conductive contact 107b. The first and second height values are different, and in the illustrated embodiment, the first height value is greater than the second height value, thereby creating a downward grade from the first electrically conductive contact 107a to the second electrically conductive contact 107b. Of course, the grade may be reversed in other embodiments. The gradient creates regions with different phase transition temperatures in the IR photodetector 100, which allows for the detection of intensity of the IR radiation. In other embodiments (FIG. 4), the gradient may be transverse to this illustrated embodiment.

The IR photodetector 100 illustratively includes a transparent electrically conductive layer 106 over the phase change material layer 105. The transparent electrically conductive layer 106 may comprise indium tin oxide, for example. In some embodiments, such as shown in FIG. 4, the IR photodetector 100 includes an inner protective layer between the phase change material layer 105 and the transparent electrically conductive layer 106. The inner protective layer may comprise hexagonal form boron nitride (h-BN), for example.

The IR photodetector 100 includes a second dielectric layer 110 over the phase change material layer. The second dielectric layer 110 may comprise silicon nitride, for example.

The IR photodetector 100 includes a graphene layer 111 over the phase change material layer 105 and having a perforated pattern 112 therein. In the illustrated embodiment, the perforated pattern comprises an array of elliptical holes (e.g. 5×8 array of circle-shaped holes (FIG. 4)). The IR photodetector 100 illustratively includes a protective layer 114 over the graphene layer 111. The protective layer 114 may comprise h-BN, for example. In some embodiments, along with the graphene layer 111, one or more of the following layers may have the same perforated pattern: the protective layer 114; the second dielectric layer 110; the transparent electrically conductive layer 106; and the phase change material layer 105.

The IR photodetector 100 illustratively comprises circuitry 102 configured to apply a bias voltage ($V_g$) between the first and second electrically conductive contacts 107a-107b. The bias voltage may comprise a pulse train or a multi-level pulse train. As discussed hereinabove, the multi-level pulse train may comprise a pulse train as depicted in FIG. 5F, oscillating between $V_1$ and $V_2$.

The circuitry 102 is configured to detect a sensing current in the phase change material layer 105 caused by IR radiation received by the graphene layer 111. In particular, the circuitry 102 is configured to apply a bias voltage ($V_b$) to the phase change material layer 105, and detect a current through the phase change material layer due to phase changes.

As will be appreciated, the spectral sensitivity of the IR photodetector 100 is tuned by the pulse train. In other words, the sensed IR radiation has a frequency range based upon the bias voltage $V_g$. In some embodiments, the graphene layer 111 may be configured to receive at least one of MWIR radiation and LWIR.

Another aspect is directed to a method of making an IR photodetector 100. The method comprises forming a first dielectric layer 104 over an electrically conductive layer 103, and forming a phase change material layer 105 over the first dielectric layer. The method further comprises forming first and second electrically conductive contacts 107a-107b coupled to the phase change material layer 105, and forming a graphene layer 111 over the phase change material layer and having a perforated pattern 112 therein. The method also includes coupling circuitry 102 to apply a bias voltage between the first and second electrically conductive contacts 107a-107b, and detect a sensing current in the phase change material layer 105 caused by IR radiation received by the graphene layer 111, the IR radiation having a frequency range based upon the bias voltage.

Referring now additionally to FIG. 4, another embodiment of the IR photodetector 200 is now described. In this embodiment of the IR photodetector 200, those elements already discussed above with respect to FIG. 7 are incremented by 100 and most require no further discussion herein. This embodiment differs from the previous embodiment in that this IR photodetector 200 illustratively includes an inner protective layer 215 between the phase change material layer 205 and the transparent electrically conductive layer 206. The inner protective layer 215 may comprise h-BN, for example. Also, the phase change material layer 205 and the second dielectric layer 210 each illustratively comprises a perforated pattern. The perforated pattern comprises an array of elliptical holes. Also, the phase change material layer 205 has a thickness gradient progressing from 12 nm to 3 nm from left to right in FIG. 4 (i.e. along a longitudinal axis of the first electrically conductive contact 207a).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

REFERENCES (INCORPORATED BY REFERENCE IN THEIR ENTIRETY)

[1] A. Rogalski, Infrared Physics & Technology 43, 187 (2002).

[2] A. Rogalski, Infrared Physics & Technology 54, 136 (2011).

[3] J. Goodenou, Journal of Solid State Chemistry 3, 490 (1971).

[4] F. J. Morin, Physical Review Letters 3, 34 (1959).

[5] S. Chandra, D. Franklin, J. Cozart, A. Safaei, and D. Chanda, ACS Photonics 5, 4513 (2018).

[6] K. Appavoo and J. Haglund, Richard F., Nano Letters 11, 1025 (2011).

[7] M. J. Dicken, K. Aydin, I. M. Pryce, L. A. Sweatlock, E. M. Boyd, S. Walavalkar, J. Ma, and H. A. Atwater, Optics Express 17, 18330 (2009).

[8] G. Stefanovich, A. Pergament, and D. Stefanovich, Journal of Physics-Condensed Matter 12, 8837 (2000).

[9] A. Cavalleri, C. Toth, C. W. Siders, J. A. Squier, F. Raksi, P. Forget, and J. C. Kieer, Physical Review Letters 87, 237401 (2001).

[10] M. Rini, Z. Hao, R. W. Schoenlein, C. Giannetti, F. Parmigiani, S. Fourmaux, J. C. Kieer, A. Fujimori, M. Onoda, S. Wall, and A. Cavalleri, Applied Physics Letters 92, 181904 (2008).

[11] G. Xu, P. Jin, M. Tazawa, and K. Yoshimura, Applied Surface Science 244, 449 (2005).

[12] A. Safaei, S. Chandra, A. VÅ½zquez-Guardado, J. Calderon, D. Franklin, L. Tetard, L. Zhai, M. N. Leuenberger, and D. Chanda, Physical Review B 96, 165431 (2017).

[13] A. S. Barker, H. W. Verleur, and H. J. Guggenheim, Phys. Rev. Lett. 17, 1286 (1966).

[14] C. Chen, X. Yi, J. Zhang, and B. Xiong, International Journal of Infrared and Millimeter Waves 22, 53 (2001).

[15] A. Safaei, S. Chandra, M. N. Leuenberger, and 8 D. Chanda, Acs Nano 13, 421 (2019).

[16] A. Safaei, S. Chandra, M. W. Shabbir, M. N. Leuenberger, and D. Chanda, Nature Communications 10, 3498 (2019).

[17] M. W. Shabbir and M. N. Leuenberger, Scientic Reports 10, 17540 (2020).

[18] H. P. Paudel, A. Safaei, and M. N. Leuenberger, in Nanoplasmonics—Fundamentals and Applications, edited by G. Barbillon (Intech, London, 2017) Chap. 3, p. 1142.

[19] Z. Wang, P. Li, Y. Chen, J. Liu, F. Qi, H. Tian, B. Zheng, and J. Zhou, Applied Surface Science 307, 712 (2014).

[20] P. U. Jepsen, B. M. Fischer, A. Thoman, H. Helm, J. Y. Suh, R. Lopez, and R. F. Haglund, Phys. Rev. B 74, 205103 (2006).

[21] L. A. L. de Almeida, G. S. Deep, A. M. N. Lima, I. A. Khrebtov, V. G. Malyarov, and H. Ne, Applied Physics Letters 85, 3605 (2004).

[22] M. M. Qazilbash, M. Brehm, G. O. Andreev, A. Frenzel, P. C. Ho, B.-G. Chae, B.-J. Kim, S. J. Yun, H.-T. Kim, A. V. Balatsky, O. G. Shpyrko, M. B. Maple, F. Keilmann, and D. N. Basov, Physical Review B 79, 075107 (2009).

[23] X. Zhong, X. Zhang, A. Gupta, and P. LeClair, Journal of Applied Physics 110, 084516 (2011).

[24] S. Samanta, A. K. Raychaudhuri, X. Zhong, and A. Gupta, Physical Review B 92, 195125 (2015).

[25] J. Ordonez-Miranda, Y. Ezzahri, K. Joulain, J. Drevillon, and J. J. Alvarado-Gil, Physical Review B 98, 075144 (2018).

[26] W. Guo, Z. Dong, Y. Xu, C. Liu, D. Wei, L. Zhang, X. Shi, C. Guo, H. Xu, G. Chen, L. Wang, K. Zhang, X. Chen, and W. Lu, Advanced Science 7, 1902699 (2020).

The invention claimed is:

1. An infrared (IR) photodetector comprising:
an electrically conductive layer;
a first dielectric layer over the electrically conductive layer;
a phase change material layer over the first dielectric layer, the phase change material layer having a thickness gradient with different phase transition temperatures;
first and second electrically conductive contacts coupled to the phase change material layer, the phase change material layer having a first height value adjacent to the first electrically conductive contact, and a second height value adjacent to the second electrically conductive contact, the second height value being different than the first height value;
a graphene layer over the phase change material layer and having a perforated pattern therein; and
circuitry configured to
apply a bias voltage between the first and second electrically conductive contacts, and
detect a sensing current in the phase change material layer caused by IR radiation received by the graphene layer and an intensity of the IR radiation, the IR radiation having a frequency range based upon the bias voltage.

2. The IR photodetector of claim 1 wherein the bias voltage comprises a pulse train.

3. The IR photodetector of claim 2 wherein the pulse train comprises a multi-level pulse train.

4. The IR photodetector of claim 1 wherein the phase change material layer comprises vanadium oxide.

5. The IR photodetector of claim 1 further comprising:
a transparent electrically conductive layer over the phase change material layer;
a second dielectric layer over the phase change material layer; and
a protective layer over the graphene layer.

6. The IR photodetector of claim 5 wherein the first dielectric layer comprises a polymer layer; and wherein the second dielectric layer comprises silicon nitride.

7. The IR photodetector of claim 1 wherein the perforated pattern comprises an array of elliptical holes.

8. The IR photodetector of claim 1 wherein the graphene layer is configured to receive at least one of mid-wavelength IR (MWIR) radiation and long wavelength IR (LWIR).

9. The IR photodetector of claim 1 wherein the electrically conductive layer comprises at least one of gold, silver, and platinum.

10. An infrared (IR) photodetector comprising:
an electrically conductive layer comprising at least one of gold, silver, and platinum;
a first dielectric layer over the electrically conductive layer;
a phase change material layer over the first dielectric layer and having a thickness gradient with different phase transition temperatures;
first and second electrically conductive contacts coupled to the phase change material layer, the phase change material layer having a first height value adjacent to the first electrically conductive contact, and a second height value adjacent to the second electrically conductive contact, the second height value being different than the first height value;
a graphene layer over the phase change material layer and having a perforated pattern therein; and
circuitry configured to
apply a pulse train bias voltage between the first and second electrically conductive contacts, and
detect a sensing current in the phase change material layer caused by IR radiation received by the graphene layer, the IR radiation having a frequency range based upon the pulse train bias voltage.

11. The IR photodetector of claim 10 wherein the pulse train bias voltage comprises a multi-level pulse train.

12. The IR photodetector of claim 10 wherein the phase change material layer comprises vanadium oxide.

13. The IR photodetector of claim 10 further comprising:
a transparent electrically conductive layer over the phase change material layer;
a second dielectric layer over the phase change material layer; and
a protective layer over the graphene layer.

14. The IR photodetector of claim 13 wherein the first dielectric layer comprises a polymer layer; and wherein the second dielectric layer comprises silicon nitride.

15. The IR photodetector of claim 10 wherein the perforated pattern comprises an array of elliptical holes.

16. The IR photodetector of claim 10 wherein the graphene layer is configured to receive at least one of mid-wavelength IR (MWIR) radiation and long wavelength IR (LWIR).

17. A method of making an infrared (IR) photodetector, the method comprising:
forming a first dielectric layer over an electrically conductive layer;
forming a phase change material layer over the first dielectric layer, the phase change material layer having a thickness gradient with different phase transition temperatures;
forming first and second electrically conductive contacts coupled to the phase change material layer, the phase change material layer having a first height value adjacent to the first electrically conductive contact, and a second height value adjacent to the second electrically conductive contact, the second height value being different than the first height value;

forming a graphene layer over the phase change material layer and having a perforated pattern therein; and coupling circuitry to apply a bias voltage between the first and second electrically conductive contacts, and detect a sensing current in the phase change material layer caused by IR radiation received by the graphene layer, the IR radiation having a frequency range based upon the bias voltage.

18. The method of claim 17 wherein the perforated pattern comprises an array of elliptical holes.

19. The method of claim 17 wherein the phase change material layer comprises vanadium oxide.

20. The method of claim 17 further comprising:

forming a transparent electrically conductive layer over the phase change material layer;

forming a second dielectric layer over the phase change material layer; and forming a protective layer over the graphene layer.

21. The method of claim 20 wherein the first dielectric layer comprises a polymer layer; and wherein the second dielectric layer comprises silicon nitride.

\* \* \* \* \*